US009583305B2

(12) United States Patent
Jung et al.

(10) Patent No.: US 9,583,305 B2
(45) Date of Patent: Feb. 28, 2017

(54) EXPOSURE METHOD USING CONTROL OF SETTLING TIMES AND METHODS OF MANUFACTURING INTEGRATED CIRCUIT DEVICES BY USING THE SAME

(71) Applicant: Samsung Electronics Co., Ltd., Suwon-si, Gyeonggi-do (KR)

(72) Inventors: Yong-Seok Jung, Hwaseong-si (KR); Shuichi Tamamushi, Hwaseong-si (KR); In-Hwan Noh, Seoul (KR); In-Kyun Shin, Yongin-si (KR); Sang-Hee Lee, Seongnam-si (KR); Jin Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 174 days.

(21) Appl. No.: 14/632,767

(22) Filed: Feb. 26, 2015

(65) Prior Publication Data
US 2015/0311032 A1    Oct. 29, 2015

Related U.S. Application Data

(60) Provisional application No. 61/983,045, filed on Apr. 23, 2014.

(30) Foreign Application Priority Data

Jun. 17, 2014   (KR) ........................ 10-2014-0073681

(51) Int. Cl.
*H01J 37/147*   (2006.01)
*H01J 37/317*   (2006.01)
*H01J 37/30*    (2006.01)

(52) U.S. Cl.
CPC ...... *H01J 37/1472* (2013.01); *H01J 37/3005* (2013.01); *H01J 37/3174* (2013.01);
(Continued)

(58) Field of Classification Search
CPC ............... H01J 37/1472; H01J 37/3174; H01J 37/3005; H01J 2237/063; H01J 2237/31715; H01J 2237/15
See application file for complete search history.

(56) References Cited

U.S. PATENT DOCUMENTS 6,509,568 B1    1/2003  Ooae et al.
7,601,968 B2   10/2009  Abe et al.
(Continued)

FOREIGN PATENT DOCUMENTS

JP    2010177490 A     8/2010
JP    2010232035 A    10/2010
(Continued)

*Primary Examiner* — Brooke Purinton
(74) *Attorney, Agent, or Firm* — Harness, Dickey & Pierce, P.L.C.

(57) ABSTRACT

An exposure method may include: radiating a charged particle beam in an exposure system comprising a beam generator, radiating the beam, and main and auxiliary deflectors deflecting the beam to determine a position of a beam shot; determining whether a deflection distance from a first position of a latest radiated beam shot to a second position of a subsequent beam shot is within a first distance in a main field area of an exposure target area, the main field area having a size determined by the main deflector; setting a settling time according to the deflection distance so that a settling time of the subsequent beam shot is set to a constant minimum value, greater than zero, when the deflection distance from the first position to the second position is within the first distance; and deflecting the beam using the main deflector based on the set settling time.

20 Claims, 20 Drawing Sheets

(52) U.S. Cl.
  CPC ..... *H01J 2237/063* (2013.01); *H01J 2237/15* (2013.01); *H01J 2237/31715* (2013.01)

(56) References Cited

U.S. PATENT DOCUMENTS

| | | | |
|---|---|---|---|
| 7,834,333 B2 | 11/2010 | Nishimura et al. | |
| 7,881,526 B2 | 2/2011 | Kawano et al. | |
| 2001/0045528 A1 | 11/2001 | Ooae et al. | |
| 2002/0020354 A1 | 2/2002 | Ooae et al. | |
| 2004/0117757 A1* | 6/2004 | Inanami ................ | B82Y 10/00 716/55 |
| 2008/0067338 A1* | 3/2008 | Nishimura ............. | B82Y 10/00 250/252.1 |
| 2009/0084990 A1* | 4/2009 | Nishimura ............. | B82Y 10/00 250/492.22 |
| 2009/0272911 A1* | 11/2009 | Goshima ................ | B82Y 10/00 250/396 R |
| 2010/0288939 A1* | 11/2010 | Nishimura ............. | B82Y 10/00 250/397 |
| 2014/0054469 A1* | 2/2014 | Nishimura .......... | H01J 37/3174 250/400 |
| 2014/0284500 A1* | 9/2014 | Nishimura .......... | H01J 37/3174 250/492.2 |
| 2015/0041671 A1* | 2/2015 | Motosugi ............ | H01J 37/3026 250/396 R |
| 2016/0233052 A1* | 8/2016 | Hirose ................ | H01J 37/3174 |

FOREIGN PATENT DOCUMENTS

| | | |
|---|---|---|
| JP | 4908799 B2 | 4/2012 |
| JP | 4948948 B2 | 6/2012 |
| JP | 2013161858 A | 8/2013 |
| KR | 19970049064 | 7/1997 |
| KR | 100350308 | 8/2002 |

\* cited by examiner

FIG. 12H
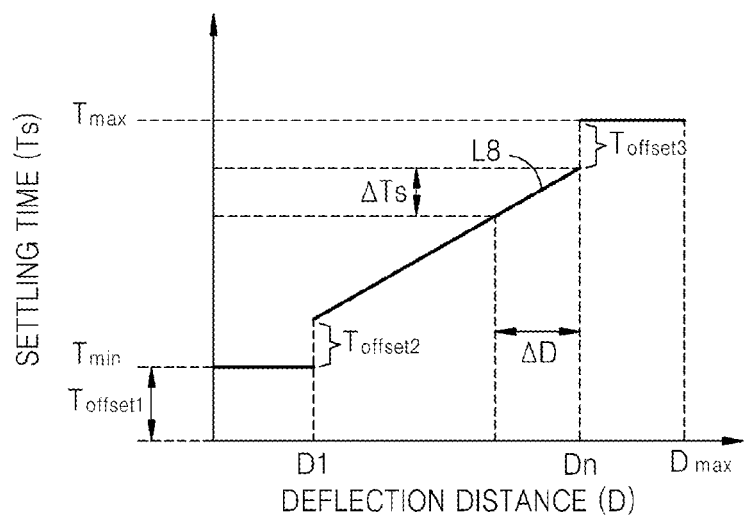
FIG. 12I
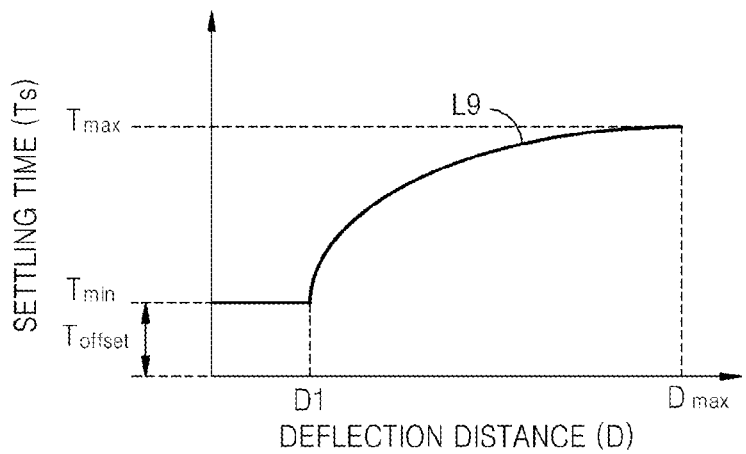
FIG. 13
| D | 0<D<D1 | DS1 | DS2 | DS3 | DS4 |
|---|--------|-----|-----|-----|-----|
| Ts | Tmin | T1 | T2 | T3 | Tmax |
200

EXPOSURE METHOD USING CONTROL OF SETTLING TIMES AND METHODS OF MANUFACTURING INTEGRATED CIRCUIT DEVICES BY USING THE SAME

CROSS-REFERENCE TO RELATED APPLICATION(S)

This application claims the benefit of U.S. Provisional Application No. 61/983,045, filed on Apr. 23, 2014, in the U.S. Patent and Trademark Office (USPTO), and claims priority from Korean Patent Application No. 10-2014-0073681, filed on Jun. 17, 2014, in the Korean Intellectual Property Office (KIPO), the entire contents of both of which are incorporated herein by reference.

BACKGROUND

1. Field

Some example embodiments of the inventive concepts may relate generally to exposure methods, and methods of manufacturing integrated circuit (IC) devices by using the exposure methods. Some example embodiments of the inventive concepts may relate generally to exposure methods using the control of settling times of deflected charged particle beams, and methods of manufacturing IC devices by using the exposure methods.

2. Description of Related Art

As the integration density of semiconductor devices increases and line widths of the semiconductor devices may be gradually miniaturized, the importance of lithography technology may have gradually increased. In addition, line widths that may be required by semiconductor devices may be gradually miniaturized according to the high integration of large-scale integrated circuits (LSI). In order to form fine patterns that may be required in such highly integrated semiconductor devices, an exposure system using a variable shaped electron beam (VSB) method may be used. In an exposure process using the exposure system with the VSB method, it may be necessary to effectively set a settling time, which may be needed to move a beam shot from the current position of the beam shot to a target position by using the deflection of the beam shot, while securing the accuracy of the exposure process.

SUMMARY

Some example embodiments of the inventive concepts may provide exposure methods that can improve throughput during exposure processes, while maintaining accuracy for irradiation positions of beams shot in performing the exposure processes by using effectively set settling times.

Some example embodiments of the inventive concepts also may provide methods of manufacturing integrated circuit devices, which can improve the productivity of exposure processes by effectively controlling settling times according to deflection distances of beams shot during the exposure processes and, thus, removing unnecessary waiting times when forming fine patterns that may be required in highly integrated semiconductor devices.

In some example embodiments, an exposure method may comprise: radiating a charged particle beam from a beam generator in an exposure system comprising the beam generator radiating the charged particle beam and main and auxiliary deflectors deflecting the beam radiated from the beam generator to determine a position of a beam shot on a substrate; determining whether a deflection distance from a first position of a latest radiated beam shot to a second position of a subsequent beam shot is within a first distance in a main field area of an exposure target area on the substrate, the main field area having a size determined by the main deflector; setting a settling time according to the deflection distance so that the settling time for stabilization of the subsequent beam shot is set to a constant minimum value, which is greater than zero, when the deflection distance from the first position to the second position is within the first distance; and/or deflecting the charged particle beam by using the main deflector to radiate the beam shot on the second position, based on the set settling time.

In some example embodiments, the main deflector may be configured to deflect the charged particle beam in a main field area having a side of a first field size. The auxiliary deflector may be configured to deflect the charged particle beam in a sub-field area having a side of a second field size that is less than the first field size. The first distance may be greater than or equal to the second field size and is less than the first field size.

In some example embodiments, the main deflector may be configured to deflect the charged particle beam in a main field area having a first field size. The auxiliary deflector may be configured to deflect the charged particle beam in a sub-field area having a second field size that is less than the first field size. A length in a first direction of the main field area may be at least 50 times a length in the first direction of the sub-field area.

In some example embodiments, the setting of the settling time according to the deflection distance may comprise setting the settling time to a constant maximum value when the deflection distance from the first position to the second position corresponds to a section from a second distance, which is greater than the first distance, to a maximum distance to which the main deflector is configured to deflect the charged particle beam.

In some example embodiments, the main deflector may be deflectable in a main field area having a first field size. The second distance may be less than the first field size.

In some example embodiments, the setting of the settling time according to the deflection distance may comprise setting the settling time to a value that is determined according to a linear function so that the settling time linearly increases depending on an increase in the deflection distance when the deflection distance from the first position to the second position is greater than the first distance.

In some example embodiments, the settling time may be set to a value that is determined by an equation (Ts=Tmin+ G×ΔD), where 'Ts' is a settling time, 'Tmin' is the constant minimum value, 'G' is a gradient of the linear function, and 'ΔD' is an amount of change of the deflection distance.

In some example embodiments, the setting of the settling time according to the deflection distance may comprise: dividing the deflection distance into a plurality of deflection distance sections in a distance range to which main deflector is configured to deflect the charged particle beam, when the deflection distance from the first position to the second position is greater than the first distance; and/or setting the settling time to a value that is determined according to a linear function so that the settling time linearly increases as the deflection distance increases in each of consecutive first and second sections selected from the plurality of deflection distance sections. The settling time may be set to a value that is determined according to a linear function having different gradients in the first section and the second section.

In some example embodiments, a minimum value of a settling time in the second section may be greater than or equal to a maximum value of a settling time in the first section.

In some example embodiments, the setting of the settling time according to the deflection distance may comprise: dividing the deflection distance into a plurality of deflection distance sections in a distance range to which the main deflector is configured to deflect the charged particle beam, when the deflection distance from the first position to the second position is greater than the first distance; and/or setting the settling time to a value that is determined according to a step function in which the settling time is discontinuously changed according to an increase in the deflection distance at a boundary of each of the plurality of deflection distance sections.

In some example embodiments, the setting of the settling time according to the deflection distance may further comprise setting the settling time to a value that is determined according to a linear function, of which a gradient is greater than zero, according to the increase in the deflection distance, in at least some of the plurality of deflection distance sections.

In some example embodiments, the setting of the settling time according to the deflection distance may comprise setting the settling time to a value that is determined based on a constant function according to the increase in the deflection distance in at least some of the plurality of deflection distance sections.

In some example embodiments, the setting of the settling time according to the deflection distance may comprise setting the settling time to a value that is determined according to a function nonlinearly increasing according to an increase in the deflection distance when the deflection distance from the first position to the second position is greater than the first distance.

In some example embodiments, the setting of the settling time to the value that is determined according to the function nonlinearly increasing according to the increase in the deflection distance may comprise setting the settling time to a value that increases in a form of a log function represented by an equation $(Ts=Tmin+\log_a(\Delta D+1))$ according to the increase in the deflection distance, where 'Ts' is a settling time, 'Tmin' is the constant minimum value, 'a' is a real number greater than zero, and '$\Delta D$' denotes an amount of change of the deflection distance from the first distance.

In some example embodiments, a method of manufacturing an integrated circuit (IC) device may comprise: loading a substrate, with a photoresist layer formed on the substrate, on an exposure stage in an exposure system comprising a beam generator radiating a charged particle beam, main and auxiliary deflectors deflecting the beam radiated from the beam generator to determine a position of a beam shot on the substrate, and the exposure stage on which exposure is performed by using the beam radiated from the beam generator; radiating the charged particle beam from the beam generator; determining whether a deflection distance from a first position of a latest radiated beam shot to a second position of a subsequent beam shot is within a first distance, which is greater than or equal to a maximum deflection distance to which the auxiliary deflector is configured to deflect the charged particle beam, in a main field area of an exposure target area on the photoresist layer, the main field area having a size determined by the main deflector; setting a settling time according to the determined deflection distance so that the settling time for stabilization of the subsequent beam shot is set to a constant minimum value, which is greater than zero, when the determined deflection distance from the first position to the second position is within the first distance; deflecting the charged particle beam by using the main deflector based on the set settling time and radiating the beam shot on the second position to expose the photoresist layer; and/or developing the exposed photoresist layer to form a photoresist pattern.

In some example embodiments, an exposure method may comprise: radiating a charged particle beam from a beam generator; deflecting the charged particle beam using first and second deflectors; determining whether a deflection distance from a first position of a latest radiated beam shot to a second position of a subsequent beam shot is within a first distance in a main field area of an exposure target area on a substrate; setting a settling time according to the determined deflection distance so that the settling time for stabilization of the subsequent beam shot is set to a constant minimum value, which is greater than zero, when the determined deflection distance is within the first distance; and/or using the first deflector, based on the set settling time, to deflect the subsequent beam shot to the second position.

In some example embodiments, the first deflector may be configured to deflect the charged particle beam over the main field area of the exposure target area on the substrate. The second deflector may be configured to deflect the charged particle beam over a second field area of the exposure target area on the substrate. The second field area may be within the main field area.

In some example embodiments, the exposure method further comprises: deflecting the charged particle beam using the first and second deflectors, and a third deflector.

In some example embodiments, the first deflector may be configured to deflect the charged particle beam over the main field area of the exposure target area on the substrate. The second deflector may be configured to deflect the charged particle beam over a second field area of the exposure target area on the substrate. The third deflector may be configured to deflect the charged particle beam over a third field area of the exposure target area on the substrate. The main field area may be larger than the second field area. The second field area may be larger than the third field area.

In some example embodiments, the third field area may be within the second field area. The second field area may be within the main field area.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIGS. 12A to 12I are graphs illustrating various examples of setting a settling time in the case of performing an exposure process according to an exposure method of some example embodiments of the inventive concepts;

FIG. 13 shows an example in which a settling time is set by using a table in the case of performing an exposure process based on an exposure method according to some example embodiments of the inventive concepts;

DETAILED DESCRIPTION OF THE EMBODIMENTS

Figure 1:
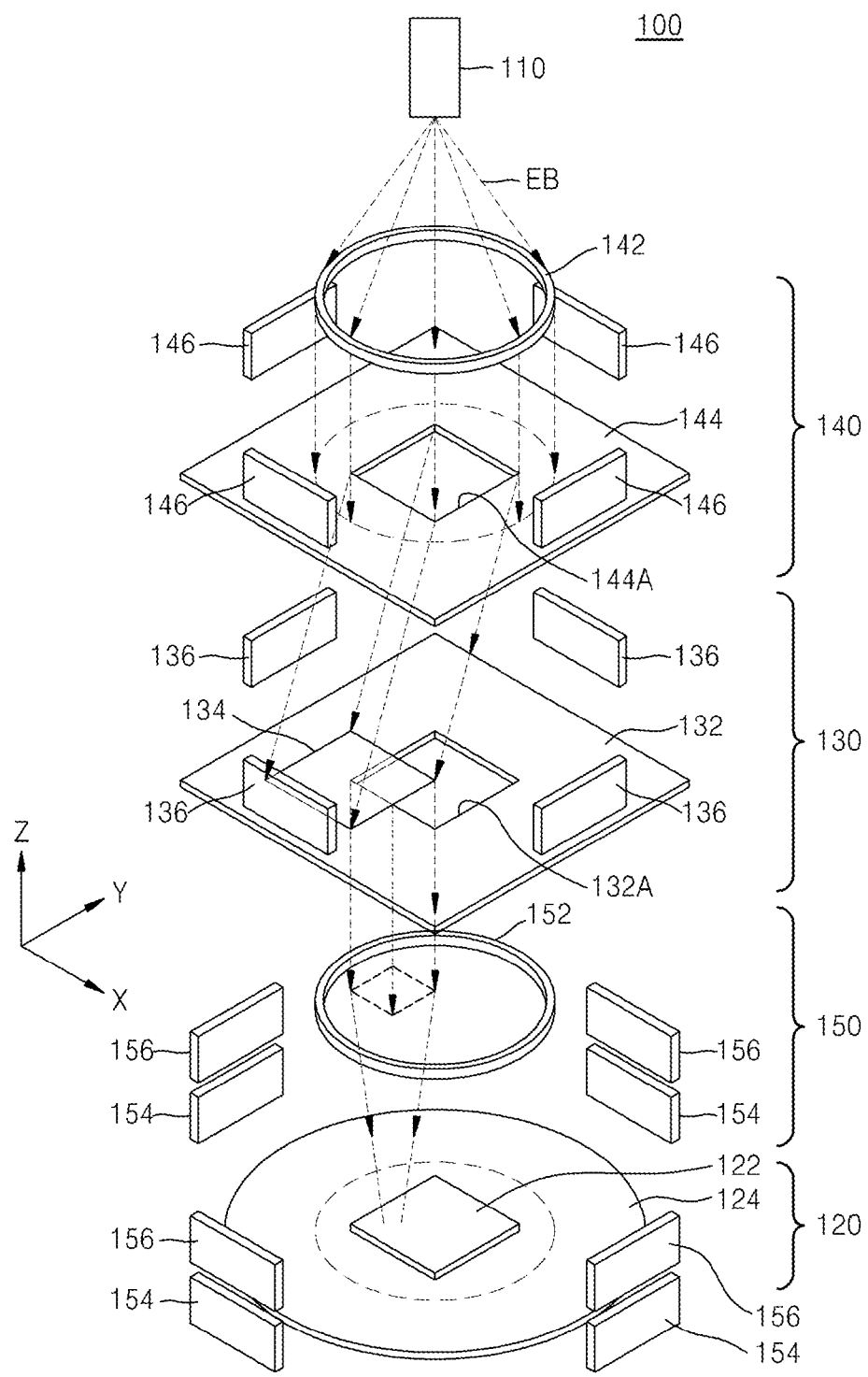
FIG. 1 is a diagram illustrating a schematic configuration of an exposure system according to some example embodiments of the inventive concepts.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a diagram illustrating a schematic configuration of an exposure system 100 according to some example embodiments of the inventive concepts. The exposure system 100 uses a variable shaped electron beam (VSB) method.

Referring to FIG. 1, the exposure system 100 includes a beam generator 110 that provides a charged particle beam (e.g., an electron beam EB), an exposure stage 120 on which exposure is performed using the electron beam EB, a beam shaper 130 that shapes the electron beam EB in a desired shape (that may or may not be predetermined) and desired size (that may or may not be predetermined), a blanking unit 140 that controls ON/OFF of the electron beam EB which is radiated onto the beam shaper 130, and a deflection and reduction projector 150 that reduces the electron beam EB shaped by the beam shaper 130, projects the reduced electron beam onto a substrate 122 loaded on the exposure stage 120, and controls the position of a beam shot that is radiated onto the substrate 122.

In some example embodiments, the beam generator 110 may include an electron beam gun for radiating the electron beam EB. In some embodiments, the beam generator 110 may radiate an ion-beam, extreme ultraviolet (EUV), or a proximity X-ray instead of the electron beam EB as the charged particle beam.

The exposure stage 120 may include the substrate 122 including a photoresist layer and an XY stage 124 on which the substrate 122 is loaded. The XY stage 124 may be controlled to be movable back and forth in X- and Y-directions in a state in which the XY stage 124 is loaded with the substrate 122. The substrate 122 may be, for example, a semiconductor wafer or a glass mask.

The blanking unit 140 may include a condenser lens 142 installed to reduce a loss of the electron beam EB radiated from the beam generator 110, and a beam shaper 144 with a first aperture 144A for modifying the shape of the electron beam EB. The shape of the electron beam EB passing through the first aperture 144A may be modified into a shape corresponding to the shape of the first aperture 144A. The blanking unit 140 may further include a deflector 146 for blanking and a blanking aperture (not shown). The electron beam EB may be controlled by the deflector 146 for blanking so that the electron beam EB passes through the blanking aperture in a beam-on state and is blocked so as not to pass through the blanking aperture in a beam-off state.

The beam shaper 130 may include a plate 132 with a second aperture 132A formed therein, an auxiliary beam shaper 134, and a variable deflector 136 for changing a beam shape, a beam size, or a beam shape and a beam size. While the electron beam EB passes through the beam shaper 130, the shape of a beam shot that is obtained from the electron beam EB may be controlled by the variable deflector 136 and the second aperture 132A.

The deflection and reduction projector 150 may include an object lens 152, a main deflector 154, and a sub-deflector 156 that is an auxiliary deflector. The electron beam EB passing through the second aperture 132A in the beam shaper 130 is focused by the object lens 152 and is deflected by the main deflector 154 and the sub-deflector 156, and a beam shot may be radiated onto a desired position of the substrate 122 disposed on the XY stage 124. The position of the beam shot that is radiated onto the substrate 122 loaded on the XY stage 124 may be determined by the main deflector 154 and the sub-deflector 156.

The variable deflector 136, the main deflector 154, and the sub-deflector 156 each may be driven and controlled by using a deflection amplifier (not shown).

Although a two-stage deflection structure including the main deflector 154 and the sub-deflector 156 is adopted, in FIG. 1, for the position deflection of a beam shot, the inventive concepts are not limited thereto. For example, a three-stage deflection structure may be adopted as described below with reference to FIG. 16.

Figure 2:
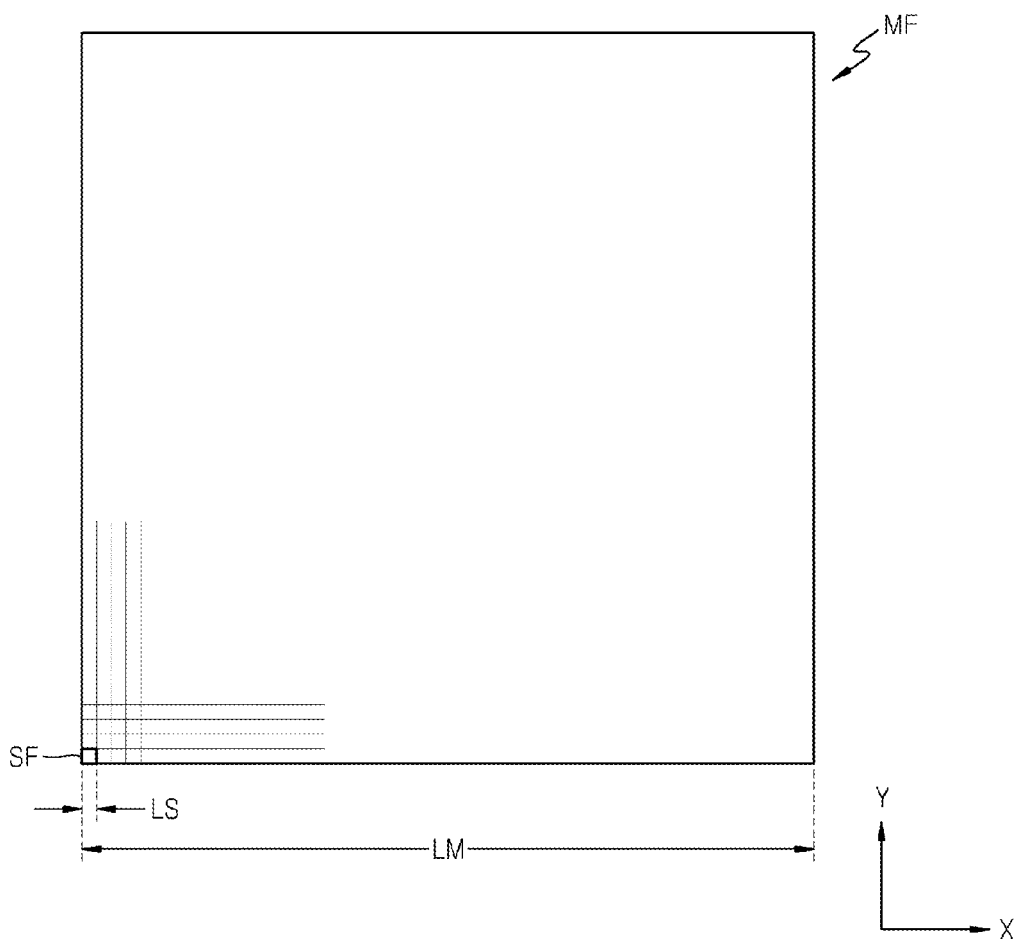
FIG. 2 is a diagram for explaining a main field area and a sub-field area in the exposure system illustrated in FIG. 1.

FIG. 2 is a diagram for explaining a main field area MF having a size in a range which may be deflected by the main deflector 154, and a sub-field area SF having a size in a range which may be deflected by the sub-deflector 156, in the exposure system 100 illustrated in FIG. 1.

Referring to FIG. 2, the main field area MF may be virtually divided into a plurality of sub-field areas SF divided in a mesh shape so as to have a certain size in the X-direction and the Y-direction.

In some example embodiments, the main field area MF may have a length of about 50 microns (μm) to about 450 μm in each of the X- and Y-directions, and each of the plurality of sub-field areas SF may have a length of about 1 μm to about 9 μm in each of the X- and Y-directions. However, the inventive concepts are not limited thereto. In some example embodiments, the main field area MF may have a square shape. The plurality of sub-field areas SF each may have a square shape.

The main field area MF is a largest field area of field areas that may be set by using a deflector in the deflection and reduction projector 150 of the exposure system 100. The plurality of sub-field areas SF are second largest field area of the field areas that may be set by using a deflector in the deflection and reduction projector 150 of the exposure system 100. In the exposure system 100, the size of the main field area MF, which is in a range that may be deflected by the main deflector 154, may be set to be relatively large if possible, and the size of the sub-field area SF, which is in a range that may be deflected by the sub-deflector 156, may be set to be relatively small if possible. In some example embodiments, the ratio (LS:LM) of the length LS of one side of the sub-field area SF to the length LM of one side of the main field area MF may be 1:50 or smaller. For example, when the length LS of one side of the sub-field area SF is 1 μm, the length LM of one side of the main field area MF may be 50 um or more.

By setting the size of the sub-field area SF to be relatively small if possible compared to the size of the main field area MF in this manner, a settling time, that is needed until a beam shot reaches a target position from the current position of the beam shot and then is stabilized, may be effectively set when moving the beam shot by using deflection in a pattern writing region on the substrate 122 in an exposure process as described below with reference to FIGS. 5-11, 12A-12I, and 13. Thus, unnecessary waiting time may be removed during the exposure process while securing the accuracy of the exposure process.

Figure 3:
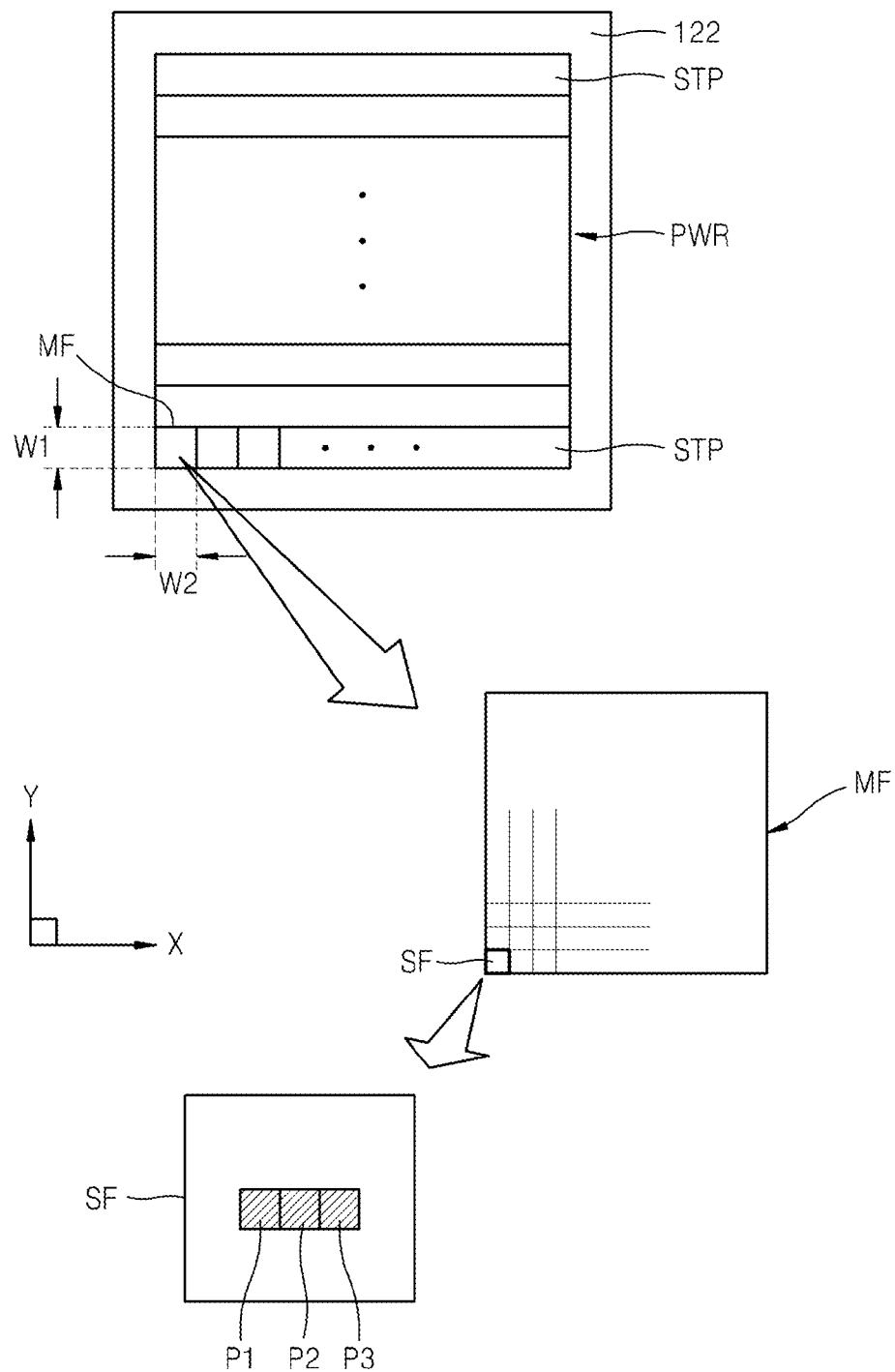
FIG. 3 is a diagram for explaining a method of dividing a pattern writing region on a substrate, in the case of performing an exposure process on the pattern writing region on the substrate, based on an exposure method according to some example embodiments of the inventive concepts by using the exposure system illustrated in FIG. 1.

FIG. 3 is a diagram for explaining a method of dividing a pattern writing region PWR on the substrate 122 in the case of processing an exposure process in the pattern writing region PWR on the substrate 122 based on an exposure method according to some example embodiments of the inventive concepts by using the exposure system 100 illustrated in FIG. 1.

Referring to FIGS. 1 and 3, the pattern writing region PWR of the substrate 122 may be virtually divided into a plurality of stripe areas STP that has a first width W1 in a range, which may be deflected by the main deflector 154 in a certain direction (e.g., the Y-direction of FIG. 3), and extends in the X-direction of FIG. 3.

A pattern having a desired shape may be written in each stripe area in the pattern writing region PWR on the substrate 122 while continuously moving the XY stage 124 in a desired direction (that may or may not be predetermined) (e.g., the X-direction).

Only a portion of the substrate 122 is illustrated in FIG. 3, and the shape of the substrate 122 is not limited to the shape illustrated in FIG. 3.

The plurality of stripe areas STP each may be virtually divided into a plurality of main field areas MF, each having a second width W2 in a range which may be deflected by the main deflector 154 in the X-direction of FIG. 3. The second width W2 may be equal to the first width W1.

In addition, the plurality of main field areas MF each may be virtually divided into a plurality of sub-field areas SF each having a size that may be deflected by the sub-deflector 156, as described with reference to FIG. 2. Patterns P1, P2, and P3 each may be written in a position on which a beam shot is radiated from among the plurality of sub-field areas SF.

Figure 4:
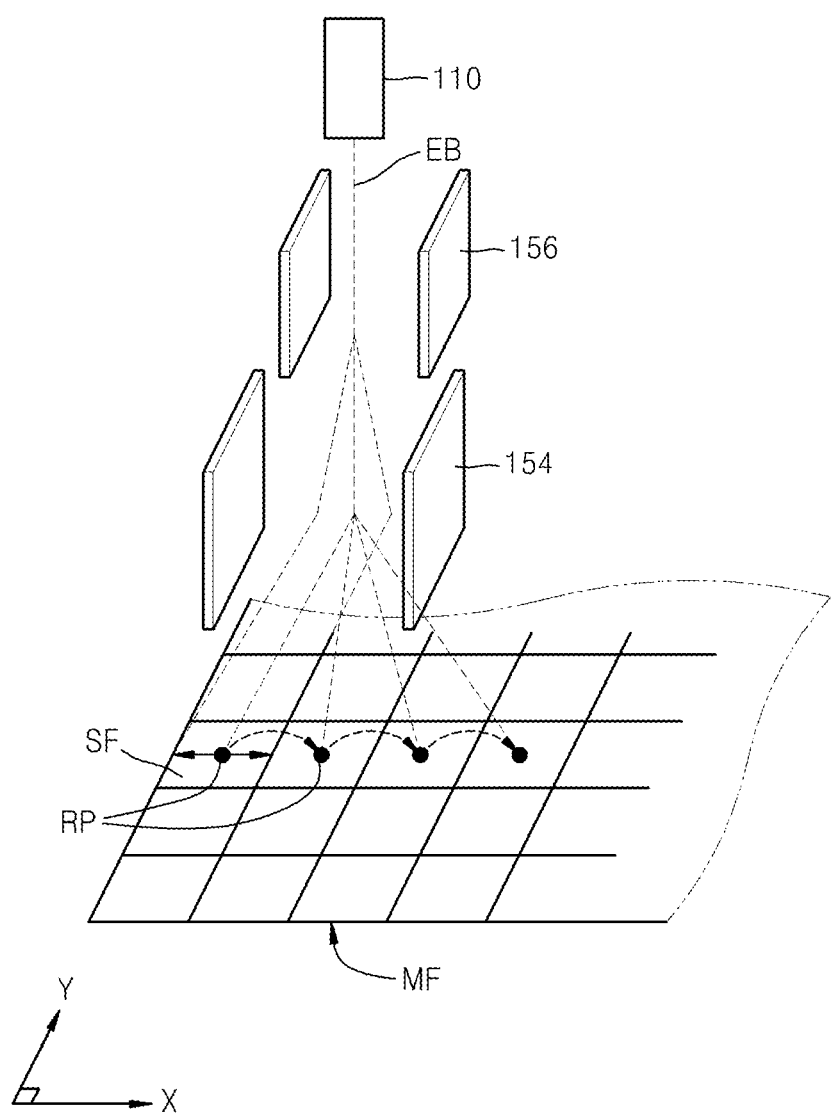
FIG. 4 is a diagram for explaining a sequence of performing an exposure process by using an exposure system based on an exposure method according to some example embodiments of the inventive concepts.

FIG. 4 is a diagram for explaining a sequence of performing an exposure process by using an exposure system based on an exposure method according to some example embodiments of the inventive concepts.

A process of writing a pattern in the main field area MF having a size in a range which may be deflected by the main deflector 154 of the exposure system 100 illustrated in FIG. 1, and the sub-field area SF having a size in a range which may be deflected by the sub-deflector 156 of the exposure system 100 is described with reference to FIGS. 1 to 4.

When writing a pattern on the substrate 122 through the radiation of an electron beam EB, the shape of a beam shot corresponding to a minimum unit and the position of the beam shot that is radiated on the substrate 122 may be determined by the variable deflector 136, the main deflector 154, and the sub-deflector 156, illustrated in FIG. 1.

In the exposure system 100 adopting the two-stage deflection structure including the main deflector 154 and the sub-deflector 156 as illustrated in FIG. 1, a beam may be scanned between each of the plurality of sub-field areas SF in the main field area MF by using the main deflector 154, and a beam may be scanned in the sub-field area SF by using the sub-deflector 156. An electromagnetic force and/or an electrostatic force may be used to deflect a beam in the main deflector 154 and the sub-deflector 156. The electromagnetic force may be generated by coils of deflection devices that control the main deflector 154 and the sub-deflector 156, respectively. The electrostatic force may be generated by deflection plates that form the main deflector 154 and the sub-deflector 156, respectively.

A beam shot that is obtained by deflecting the electron beam EB through the main deflector 154 and the sub-deflector 156 may be imaged in an array of matrix shapes on the substrate 122. The main deflector 154 may deflect the electron beam EB so that the electron beam EB may be radiated on a reference position RP of a sub-field area SF for subsequent writing according to the movement of the XY stage 124. The sub-deflector 156 may deflect the electron beam EB from the reference position RP of each sub-field area SF to a position in the sub-field area SF on which a beam has to be radiated.

For example, a writing may be performed in the X-direction with respect to a first stripe area STP while the XY stage 124 illustrated in FIG. 1 continuously moves in the X-direction of FIG. 4. After the writing for the first stripe area STP is completed, a writing for a second stripe area STP may be performed in the same direction (the X-direction) as a previous direction or the opposite direction thereto. Next, writings for subsequent stripe areas STP may be performed in a similar manner. In this manner, a writing process may be performed with respect to the plurality of stripe areas STP in turn by using the main deflector 154 and the sub-deflector 156.

As the integration density of semiconductor devices increases, the importance of lithography technology has gradually increased. In addition, line widths that are required by semiconductor devices are gradually miniaturized according to the high integration of large-scale integrated circuits (LSI). In order to form fine patterns that are required in such highly integrated semiconductor devices, the exposure system 100 using the VSB method, illustrated in FIG. 1, may be used. In the exposure system 100 using the VSB method, a charged particle beam, such as the electron beam EB or the like, may be deflected by using a deflector to perform an exposure.

In the case of performing an exposure process like that described with reference to FIG. 4, when moving a beam shot via deflection in a pattern writing region on the substrate 122, time is needed until the beam shot reaches a target position from the current position of the beam shot and then is stabilized. In the present specification, the time required for the stabilization of the beam shot is referred to as a settling time. In the case of moving a beam shot from the current position of the beam shot to a target position when moving the beam shot via deflection, it is necessary to set an appropriate settling time to reduce an exposure time and improve throughput while securing the accuracy of the exposure process. When a settling time applied when moving a beam shot via deflection is too small compared to an optimized settling time, an error may occur in a deflection movement distance. When the settling time applied when moving a beam shot via deflection is too large compared to the optimized settling time, an exposure time may be lengthened and, thus, throughput may be deteriorated. Accordingly, it is desired to set the settling time to be as short as possible without deteriorating dimension accuracy.

In some example embodiments of the inventive concepts, there is provided an exposure method that may improve throughput during an exposure process for the formation of a desired pattern by performing the exposure process through as short a settling time as possible while maintaining accuracy for an irradiation position of a beam shot during the exposure process. There is also provided a method of manufacturing an integrated circuit (IC) device by using the exposure method.

Figure 5:
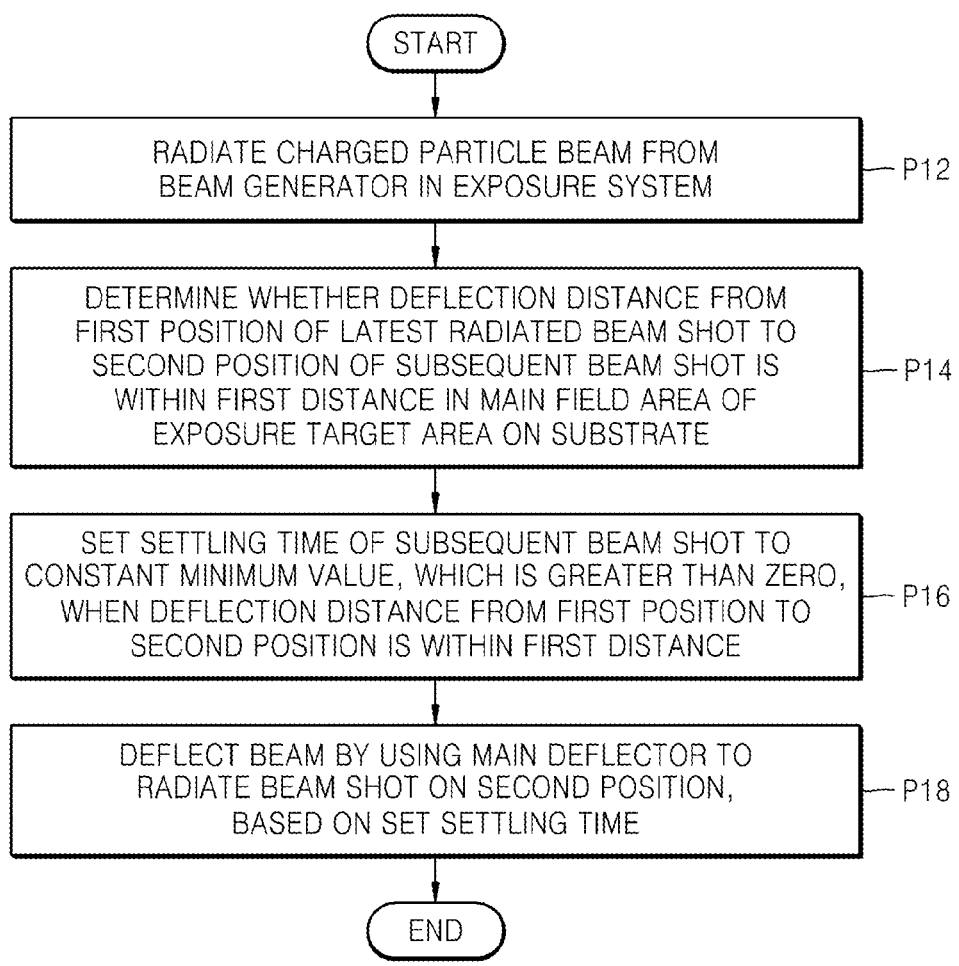
FIG. 5 is a flowchart of an exposure method according to some example embodiments of the inventive concepts.

FIG. 5 is a flowchart of an exposure method according to some example embodiments of the inventive concepts.

The exposure method according to some example embodiments is described with reference to FIGS. 1 to 5.

In an operation P12, a charged particle beam (e.g., an electron beam EB), is radiated from the beam generator 110 in the exposure system 100 illustrated in FIG. 1.

In the exposure system 100, the main deflector 154 can deflect the charged particle beam in the main field area MF having a first field size. The first field size may denote the length LM of one side of the main field area MF, as illustrated in FIG. 2. The main field area MF may have a square shape in which each side has the same length LM.

In the exposure system 100, the sub-deflector 156 can deflect the charged particle beam in the sub-field area SF having a second field size that is less than the first field size. The second field size may denote the length LS of one side of the sub-field area SF, as illustrated in FIG. 2. The sub-field area SF may have a square shape in which each side has the same length LS.

A length in a first direction of the main field area MF, for example, the X-direction or Y-direction of FIG. 2, may be about at least 50 times a length in the first direction of the sub-field area SF.

In an operation P14, it is determined whether a deflection distance from a first position of the latest radiated beam shot to a second position of a subsequent beam shot is within a first distance (a desired reference distance that may or may not be predetermined) in the main field area MF of the pattern writing region PWR that is an exposure target area on the substrate 122, where the main field area MF has a size determined by the main deflector 154.

Figure 6:
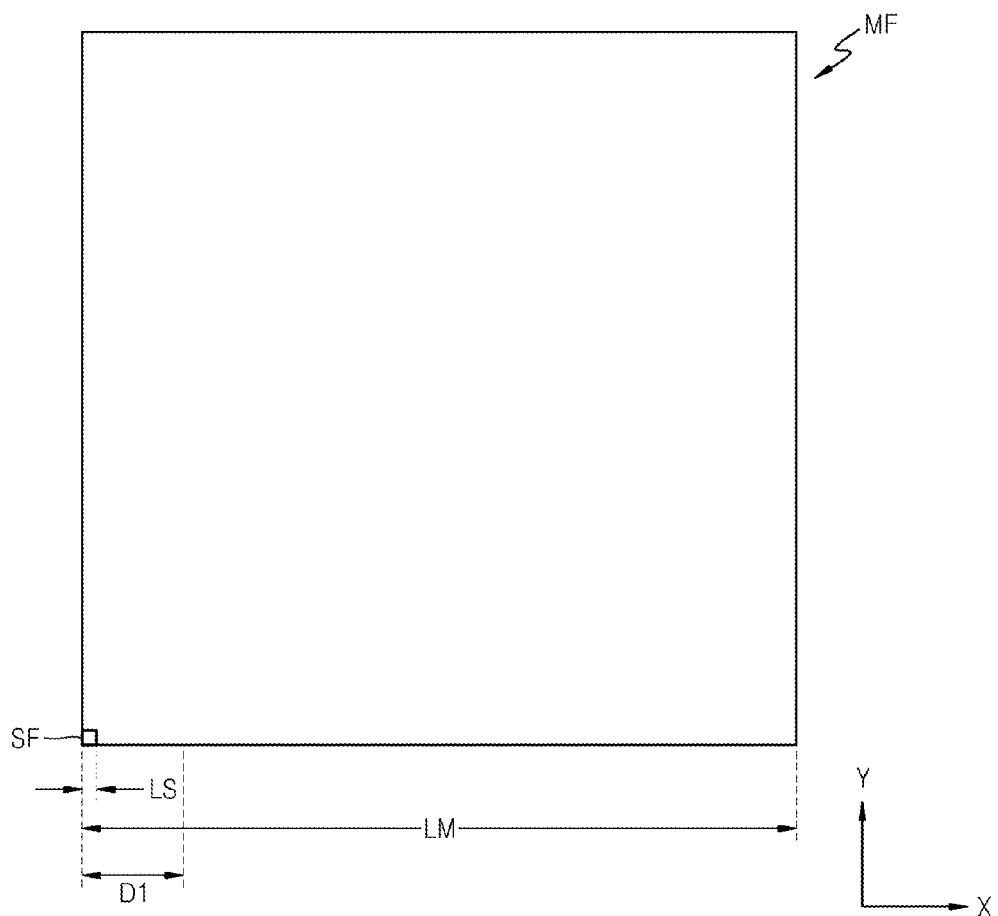
FIG. 6 is a diagram illustrating a range that may be selected as a first distance, which is a reference distance for setting a settling time to a minimum value, in an operation of performing an exposure process based on an exposure method according to some example embodiments of the inventive concepts.

FIG. 6 is a diagram illustrating a range that may be selected as a first distance D1, which is the reference distance described in the operation P14 of FIG. 5.

As illustrated in FIG. 6, the first distance D1 may be greater than or equal to the second field size (e.g., LS) of the sub-field area SF. Also, the first distance D1 may be less than the first field size (e.g., LM) of the main field area MF.

However, according to the inventive concepts, a selectable range of the first distance D1 is not limited to the case illustrated in FIG. 6 and the first distance D1 may be variously modified and changed.

In an operation P16 of FIG. 5, when a deflection distance from the first position to the second position is within the first distance D1, a settling time is set according to the deflection distance so that a settling time for the stabilization of the subsequent beam shot is set to a constant minimum value that is greater than zero.

For example, when the first distance D1 is set to the same size as the second field size (e.g., LS) of the sub-field area SF in FIG. 6, a minimum value may be uniformly applied as the settling time regardless of the size of a deflection distance if a deflection distance of a beam shot deflected by the main deflector 154 is within the same range as the second field size (e.g., LS).

FIGS. 12A to 12I are graphs illustrating various examples of setting a settling time in the case of performing an exposure process according to an exposure method of some example embodiments of the inventive concepts.

In the case of setting a minimum value Tmin of a settling time Ts in the operation P16 of FIG. 5, the settling time Ts of a beam shot deflected by the main deflector 154 may be set to maintain the minimum value Tmin if a deflection distance D of the beam shot deflected by the main deflector 154 is within the first distance D1, as illustrated in FIGS. 12A to 12I. That is, if the deflection distance D of the beam shot deflected by the main deflector 154 is within the first distance D1, the minimum value Tmin may be uniformly applied as the settling time Ts regardless of the deflection distance D.

As illustrated in FIGS. 12A to 12I, the minimum value Tmin of the settling time Ts of the beam shot deflected by the main deflector 154 may have offset values Toffset and Toffset1 that are greater than zero. In some example embodiments, the offset value Toffset illustrated in FIGS. 12A, 12B, 12F, 12G, and 12I or the offset value Toffset1 illustrated in FIGS. 12C, 12D, 12E, and 12H may be applied up to a distance corresponding to the length of one side of the sub-field area SF. In some example embodiments, the offset values Toffset and Toffset1 may be selected within the range of about 30 nanoseconds (nsec) to about 35 nsec. However, the inventive concepts are not limited thereto.

In an operation P18 of FIG. 5, the beam is deflected by using the main deflector 154 to radiate a beam shot on a second position on the substrate 122, based on a settling time set according to the deflection distance in the operation P16.

In the exposure method according to the example embodiment described with reference to FIG. 5, the settling time Ts may be prevented from being longer than needed while travelling a relatively short deflection distance by uniformly setting the settling time Ts to the minimum value Tmin regardless of the deflection distance in the case where the deflection distance D of a beam shot deflected by the main deflector 154 is within the first distance D1. Accordingly, the productivity of an exposure process may be improved by removing unnecessary waiting time.

Below, like reference numerals are used with respect to the same process as that described with reference to FIG. 5 and, thus, detailed descriptions thereof will be omitted.

Figure 7:
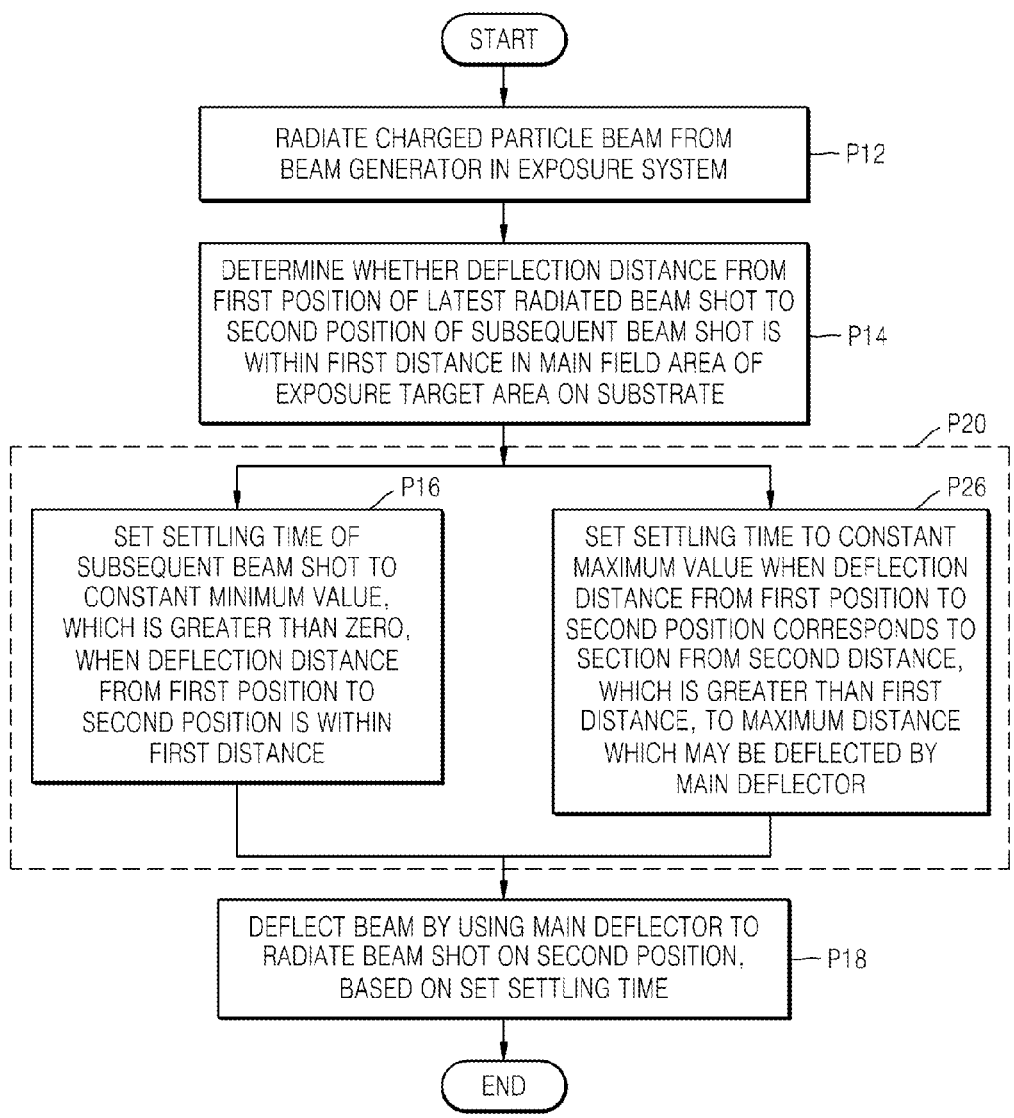
FIG. 7 is a flowchart of an exposure method according to some example embodiments of the inventive concepts.

FIG. 7 is a flowchart of an exposure method according to some example embodiments of the inventive concepts.

The exposure method according to some example embodiments is described with reference to FIGS. 1 to 6, 7, and 12A to 12I.

The exposure method illustrated in FIG. 7 includes a settling time setting operation P20 that is similar to the settling time setting operation of the operation P16 in the exposure method illustrated in FIG. 5. That is, the settling time setting operation P20 included in the exposure method of FIG. 7 includes an operation P16 of setting the settling time Ts to a minimum value Tmin when the deflection distance D is within the first distance D1.

Also, as illustrated in FIGS. 12E, 12F, 12G, and 12H, the settling time setting operation P20 includes an operation P26 of setting the settling time Ts to a maximum value Tmax when a deflection distance D from the first position to the second position is greater than the first distance D1 and corresponds to a section from an nth distance Dn, which is less than a maximum distance Dmax which may be deflected by the main deflector 154, to the maximum distance Dmax.

In the exposure method according to the example embodiment described with reference to FIG. 7, the minimum value Tmin is uniformly applied as the settling time Ts regardless of the deflection distance in the case where the deflection distance D of a beam shot deflected by the main deflector 154 is within the first distance D1, and the maximum value Tmax is uniformly applied as the settling time Ts regardless of the deflection distance when the deflection distance D corresponds to an section from the nth distance Dn, which is less than the maximum distance Dmax which may be deflected by the main deflector 154, to the maximum distance Dmax. Thus, the settling time Ts may be prevented from being longer than needed while travelling a relatively short deflection distance, and the setting of a settling time that is unconditionally proportional to a deflection distance and, thus, is longer than needed may be suppressed also in the case of travelling a relatively long deflection distance. As a result, a time that is required for an exposure process may be effectively reduced and, thus, the productivity of an exposure process may be improved by removing unnecessary waiting time.

Figure 8:
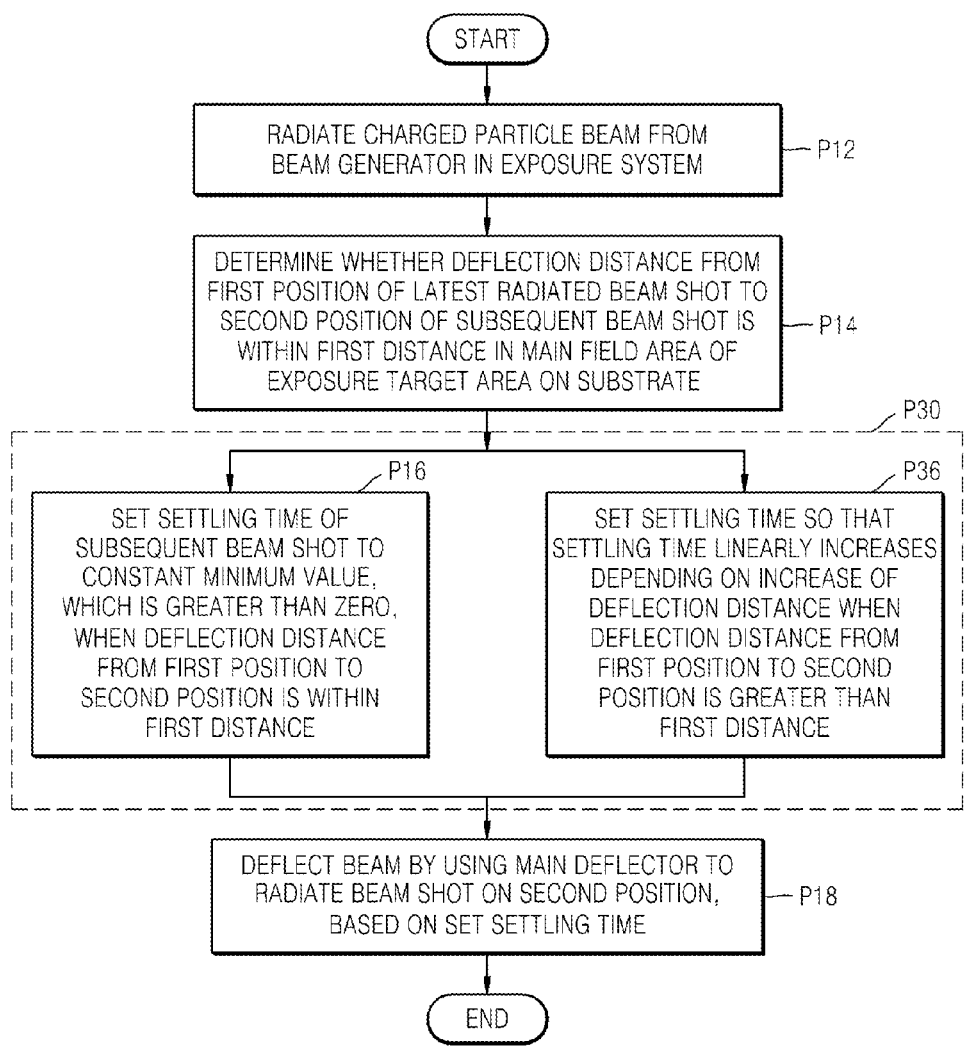
FIG. 8 is a flowchart of an exposure method according to some example embodiments of the inventive concepts.

FIG. 8 is a flowchart of an exposure method according to some example embodiments of the inventive concepts.

The exposure method according to some example embodiments is described with reference to FIGS. 1 to 6, 8, and 12A to 12I.

The exposure method illustrated in FIG. 8 includes a settling time setting operation P30 that is similar to the settling time setting operation of the operation P16 in the exposure method illustrated in FIG. 5. That is, the settling time setting operation P30 included in the exposure method of FIG. 8 includes an operation P16 of setting the settling time Ts to a minimum value Tmin when the deflection distance D is within the first distance D1.

Figure 12A:
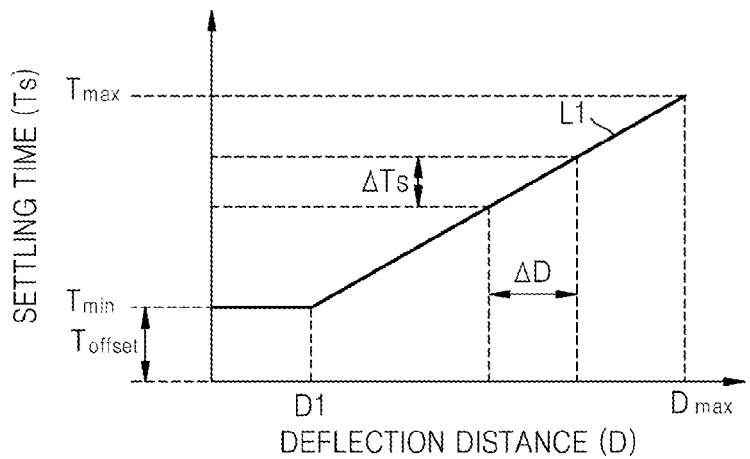

Also, as illustrated by L1 of FIG. 12A; L21 and L22 of FIG. 12B; L3 of FIG. 12C; L41, L42, L43, and L44 of FIG. 12D; L6 of FIG. 12F; L71 and L72 of FIG. 12G; and L8 of FIG. 12H; the settling time setting operation P30 includes an operation P36 of setting the settling time Ts to a value that is determined according to a linear function so that the settling time Ts linearly increases depending on the increase of the deflection distance D when the deflection distance D from the first position to the second position is greater than the first distance D1.

In the operation P36 of FIG. 8, the settling time Ts may be set to a value of a linear function which is determined by Equation 1.

$$Ts = Tmin + G \times \Delta D \quad (1)$$

In Equation 1, 'G' denotes a gain, and 'ΔD' denotes an amount of change of the deflection distance D from the first distance D1. For example, 'G' may correspond to a gradient of each of linear functions illustrated by L1 of FIG. 12A; L21 and L22 of FIG. 12B; L3 of FIG. 12C; L41, L42, L43, and L44 of FIG. 12D; L6 of FIG. 12F; L71 and L72 of FIG. 12G; and L8 of FIG. 12H. That is, the gain G may be defined as the rate of change of the settling time Ts in a section that is represented by a linear function, and may correspond to a value ΔTs/ΔD obtained by dividing the amount of change of the settling time Ts by the amount of change of the deflection distance D. The gain G may have a value that is greater than zero.

In some example embodiments, the gain G in a linearly increasing section of the settling time Ts may be determined based on experimental values for critical dimension (CD) deviation of a pattern that is desired to be implemented on the substrate 122 through an exposure process.

Figure 9:
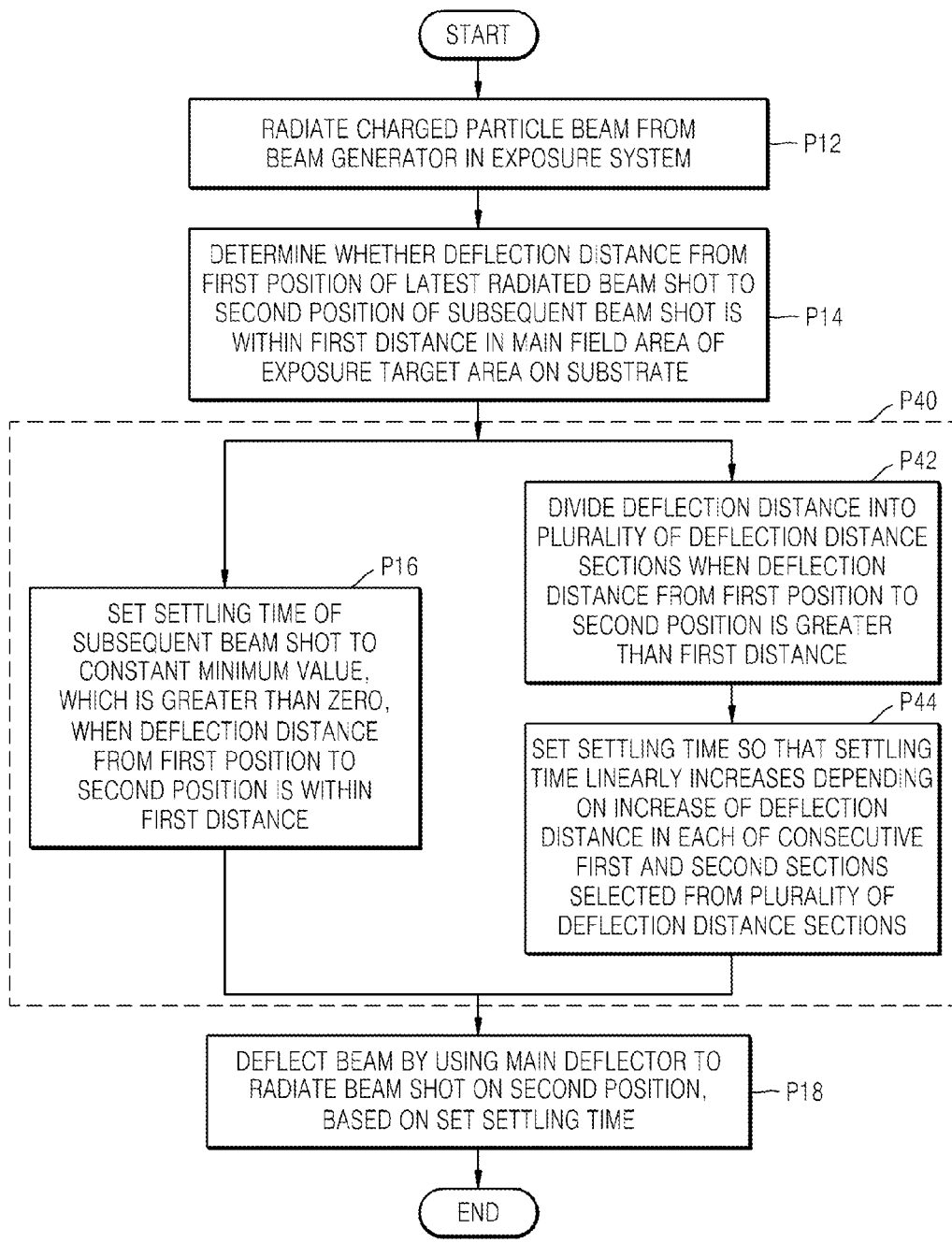
FIG. 9 is a flowchart of an exposure method according to some example embodiments of the inventive concepts.

FIG. 9 is a flowchart of an exposure method according to some example embodiments of the inventive concepts.

The exposure method according to some example embodiments is described with reference to FIGS. 1 to 6, 9, and 12A to 12I.

The exposure method illustrated in FIG. 9 includes a settling time setting operation P40 that is similar to the settling time setting operation of the operation P16 in the exposure method illustrated in FIG. 5. That is, the settling time setting operation P40 included in the exposure method of FIG. 9 includes an operation P16 of setting the settling time Ts to a minimum value Tmin when the deflection distance D is within the first distance D1.

Figure 12B:
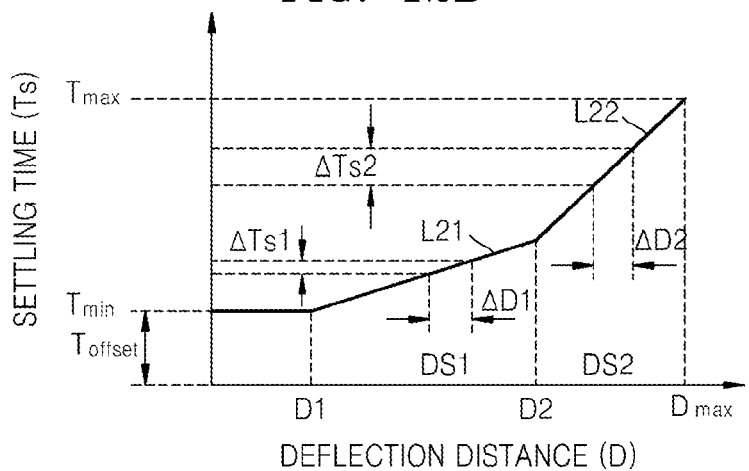
Figure 12C:
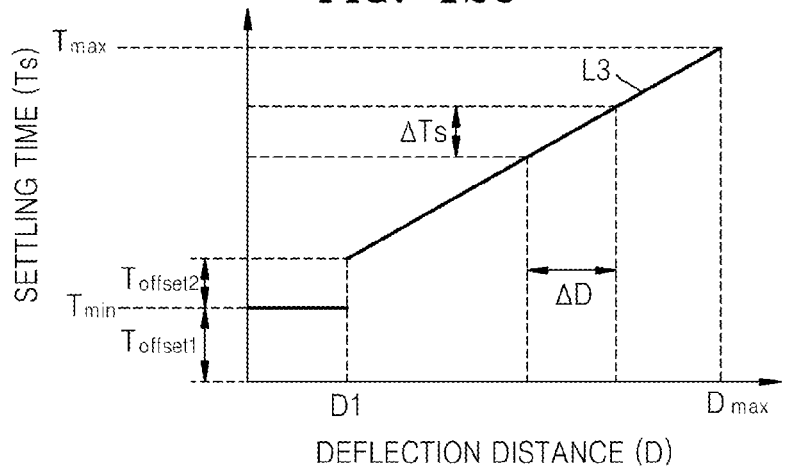

Also, as illustrated by L21 and L22 of FIG. 12B; L41, L42, L43, and L44 of FIG. 12D; and L71 and L72 of FIG. 12G; the settling time setting operation P40 includes an operation P42 of dividing the deflection distance D into a plurality of deflection distance sections in a distance range, which may be deflected by the main deflector 154, when the deflection distance D from the first position to the second position is greater than the first distance D1.

In a settling time setting example illustrated in FIG. 12B, the deflection distance D is divided into two deflection distance sections (e.g., first deflection distance section DS1, from first distance D1 to second distance D2, and second deflection distance section DS2, from second distance D2 to maximum distance Dmax; first and second deflection distance sections DS1 and DS2 may or may not represent the same length). In a settling time setting example illustrated in FIG. 12D, the deflection distance D is divided into four deflection distance sections (e.g., first through fourth deflection distance sections DS1, DS2, DS3, and DS4; first, second, third, and fourth deflection distance sections DS1, DS2, DS3, and DS4 may or may not represent the same length).

In addition, the settling time setting operation P40 further includes an operation P44 of setting the settling time Ts to a value that is determined according to a linear function so that the settling time Ts linearly increases as the deflection distance D increases in each of consecutive first and second sections selected from the plurality of deflection distance sections. The settling time Ts may be set to a value that is determined according to a linear function having different gradients in the first section and the second section.

In the settling time setting example illustrated in FIG. 12B, the settling time Ts may be determined according to Equation 1 based on different gain values ΔTs1/ΔD1 and ΔTs2/ΔD2 in the first deflection distance section DS1 and the second deflection distance section DS2, respectively.

Figure 12D:
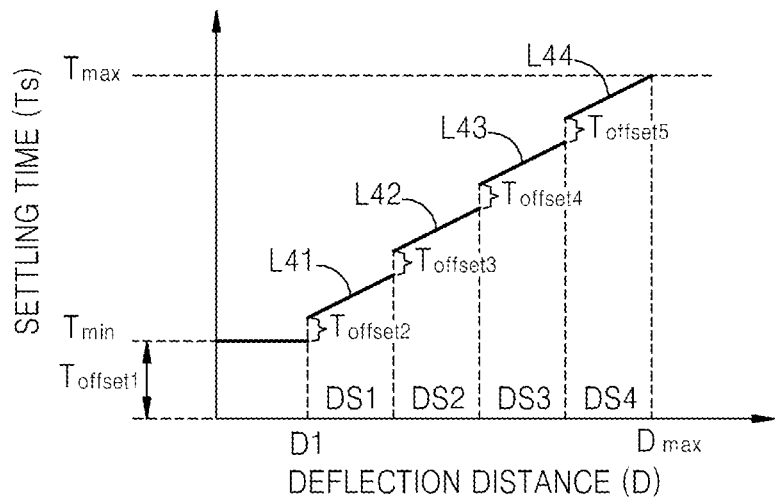

In the exposure method illustrated in FIG. 9, a minimum value of a settling time Ts of the second deflection distance section DS2, which is determined in the operation P44, may be equal to a maximum value of a settling time Ts of the first deflection distance section DS1, as illustrated in FIG. 12B. In addition, as illustrated in FIG. 12D, the minimum value of the settling time Ts of the second deflection distance section DS2 may be greater than the maximum value of the settling time Ts of the first deflection distance section DS1 by an offset value Toffset2.

Figure 10:
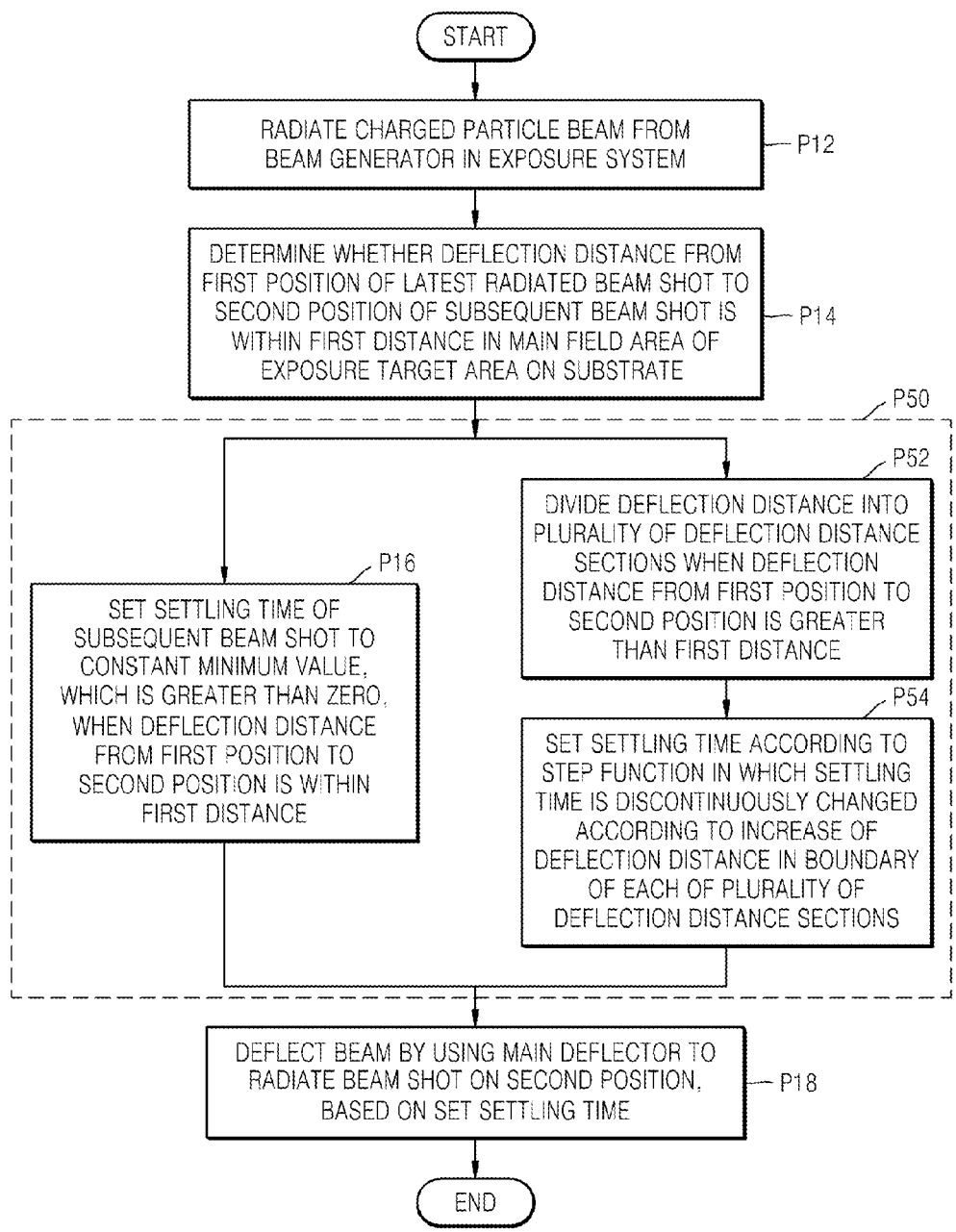
FIG. 10 is a flowchart of an exposure method according to some example embodiments of the inventive concepts.

FIG. 10 is a flowchart of an exposure method according to some example embodiments of the inventive concepts.

The exposure method according to some example embodiments is described with reference to FIGS. 1 to 6, 10, and 12A to 12I.

The exposure method illustrated in FIG. 10 includes a settling time setting operation P50 that is similar to the settling time setting operation of the operation P16 in the exposure method illustrated in FIG. 5. That is, the settling time setting operation P50 included in the exposure method of FIG. 10 includes an operation P16 of setting the settling time Ts to a minimum value Tmin when the deflection distance D is within the first distance D1.

Figure 12E:
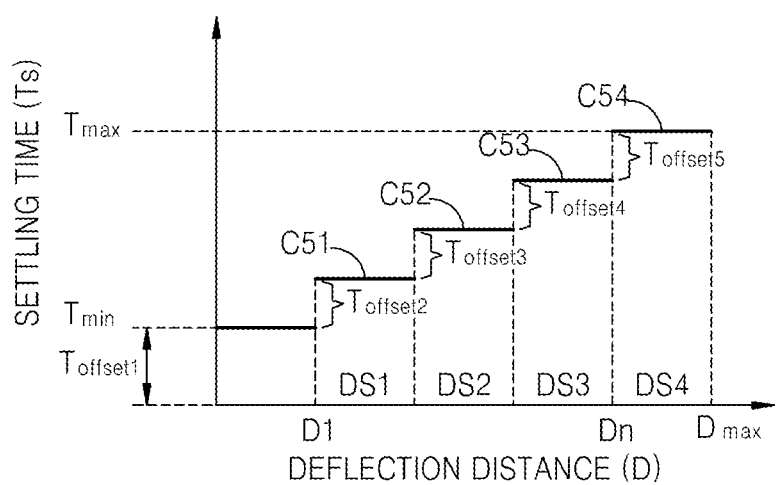
Figure 12F:
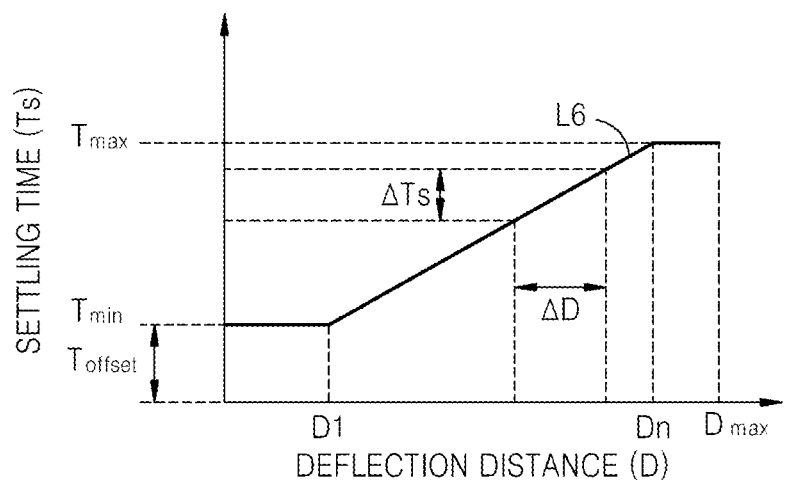
Figure 12G:
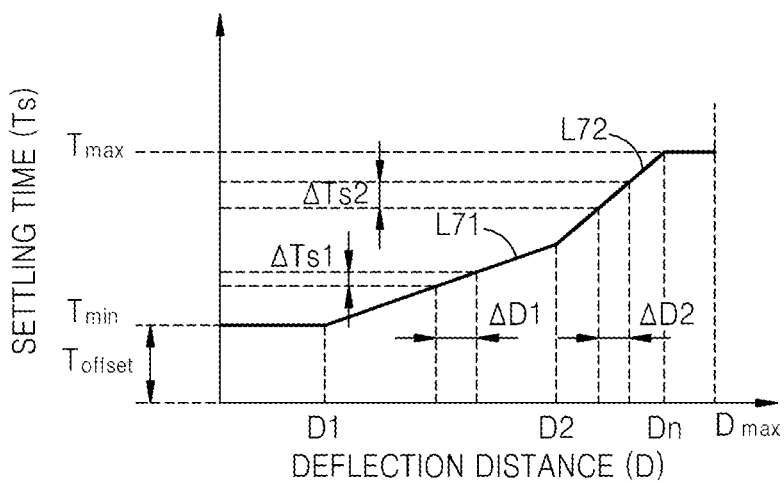

Also, as illustrated by L41, L42, L43, and L44 of FIG. 12D; and C51, C52, C53, and C54 of FIG. 12E; the settling time setting operation P50 includes an operation P52 of dividing the deflection distance D into a plurality of deflection distance sections DS1, DS2, DS3, and DS4 in a distance range, which may be deflected by the main deflector 154, when the deflection distance D from the first position to the second position is greater than the first distance D1 (first, second, third, and fourth deflection distance sections DS1, DS2, DS3, and DS4 may or may not represent the same length).

In addition, the settling time setting operation P50 includes an operation P54 of setting the settling time Ts to a value that is determined according to a step function in which the settling time Ts is discontinuously changed according to the increase of the deflection distance D at a boundary of each of the plurality of deflection distance sections DS1, DS2, DS3, and DS4.

As illustrated in FIGS. 12D and 12E, offset values Toffset2, Toffset3, Toffset4, and Toffset5 each are provided so that at the boundaries of each of the plurality of deflection distance sections DS1, DS2, DS3, and DS4, a minimum value of a settling time Ts of a subsequent section is greater than a maximum value of a settling time Ts of a previous section. Accordingly, in the boundary of each of the plurality of deflection distance sections DS1, DS2, DS3, and DS4, the settling time Ts is discontinuously changed according to the increase of the deflection distance D.

According to a settling time setting example illustrated in FIG. 12D, the settling time Ts in each of the plurality of deflection distance sections DS1, DS2, DS3, and DS4 is set to a value that is determined based on a linear function having a gradient that is greater than zero according to the increase of the deflection distance D, taking into account the discontinuous changes at the boundaries of the plurality of deflection distance sections DS1, DS2, DS3, and DS4 discussed above.

According to a settling time setting example illustrated in FIG. 12E, the settling time Ts in each of the plurality of deflection distance sections DS1, DS2, DS3, and DS4 is set to a value that is determined based on a constant function according to the increase of the deflection distance D, taking into account the discontinuous changes at the boundaries of the plurality of deflection distance sections DS1, DS2, DS3, and DS4 discussed above.

Figure 11:
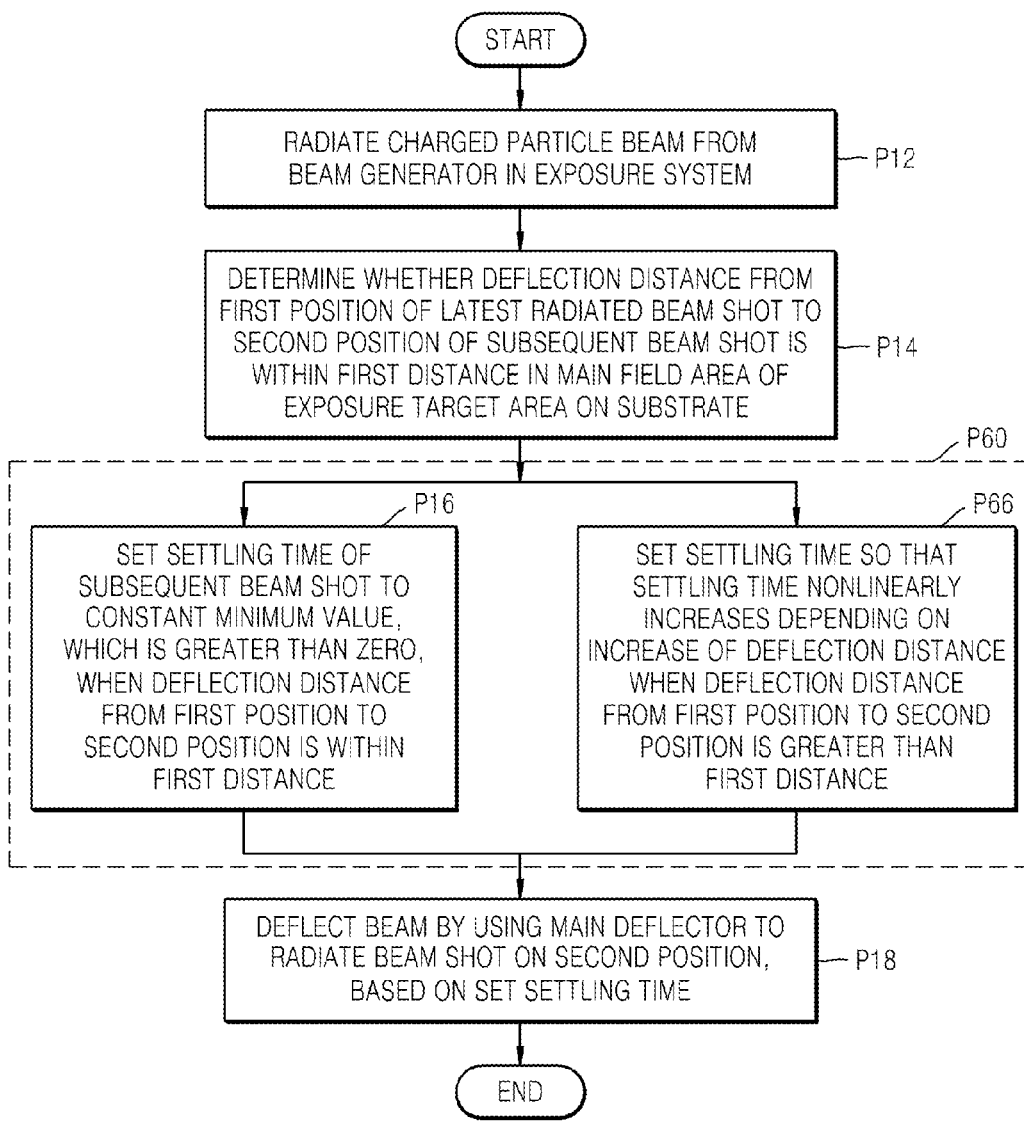
FIG. 11 is a flowchart of an exposure method according to some example embodiments of the inventive concepts.

FIG. 11 is a flowchart of an exposure method according to some example embodiments of the inventive concepts.

The exposure method according to some example embodiments is described with reference to FIGS. 1 to 6, 11, and 12A to 12I.

The exposure method illustrated in FIG. 11 includes a settling time setting operation P60 that is similar to the settling time setting operation of the operation P16 in the exposure method illustrated in FIG. 5. That is, the settling time setting operation P60 included in the exposure method of FIG. 11 includes an operation P16 of setting the settling time Ts to a minimum value Tmin when the deflection distance D is within the first distance D1.

Also, as illustrated by L9 of FIG. 12I, the settling time setting operation P60 includes an operation P66 of setting the settling time Ts to a value that is determined according to a function in which the settling time Ts nonlinearly increases depending on the increase of the deflection distance D when the deflection distance D from the first position to the second position is greater than the first distance D1.

In the operation P66 of FIG. 11, the settling time Ts may be set, for example, to a value that increases in a form of a logarithmic function according to Equation 2.

$$Ts = T\min + \log_a(\Delta D + 1) \quad (2)$$

In Equation 2, 'a' is a real number greater than zero and 'ΔD' denotes an amount of change of the deflection distance D from the first distance D1, where the '1' is added so that the value of the logarithmic function is '0' at the first distance D1, where ΔD=0.

FIG. 13 shows an example in which the settling time Ts is set by using a table 200 in the case of setting the settling time Ts to a value that is determined according to a constant function, as illustrated in FIG. 12E. For example, in FIG. 12E, settling time Ts in first deflection distance section DS1 may be T1, settling time Ts in second deflection distance section DS2 may be T2, settling time Ts in third deflection distance section DS3 may be T3, and settling time Ts in fourth deflection distance section DS4 may be Tmax.

By using the table 200 illustrated in FIG. 13 in the case of setting the settling time Ts based on the deflection distance D according to an exposure method of some example embodiments of the inventive concepts, it is possible to easily check the settling time Ts set by using the table 200 with respect to a required deflection distance D.

Figure 14:
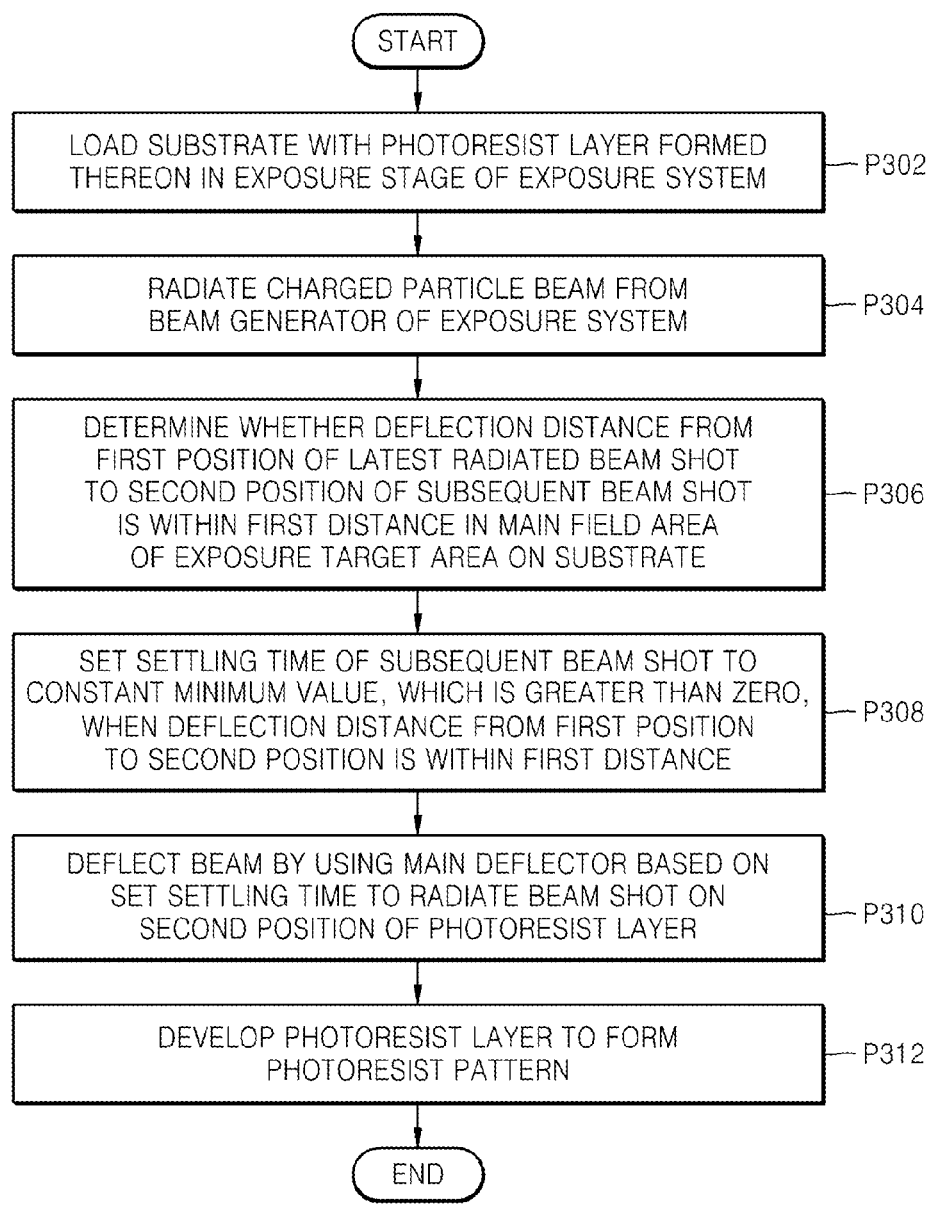
FIG. 14 is a flowchart of a method of manufacturing an integrated circuit (IC) device, according to some example embodiments of the inventive concepts.

FIG. 14 is a flowchart of a method of manufacturing an IC device, according to some example embodiments of the inventive concepts.

The method of manufacturing an IC device is described with reference to FIGS. 1 to 4 and 14.

In an operation P302 of FIG. 14, a substrate 122 with a photoresist layer formed thereon is loaded in the exposure stage (e.g., the XY stage 124) of the exposure system 100 having the configuration illustrated in FIG. 1.

The substrate 122 may include a feature layer, and the photoresist layer may be formed to cover the feature layer on the substrate 122.

In some example embodiments, the feature layer may be a conductive layer or an insulating layer. For example, the feature layer may be formed of metal, semiconductor, or insulating material. In some example embodiments, the feature layer may be a portion of the substrate 122.

The photoresist layer may also be formed of a resist for extreme ultraviolet (EUV) (13.5 nanometers (nm)), a resist for excimer laser (157 nm), a resist for ArF excimer laser (193 nm), or a resist for KrF excimer laser (248 nm). The photoresist layer may be formed of a positive-type photoresist or a negative-type photoresist.

In an operation P304, a charged particle beam (e.g., an electron beam EB), is radiated from the beam generator 110 of the exposure system 100, similar to that described with respect to the operation P12 of FIG. 5.

In an operation P306, it is determined whether a deflection distance from a first position of the latest radiated beam shot to a second position of a subsequent beam shot is within a first distance (a desired reference distance that may or may not be predetermined) in the main field area MF of a pattern writing region that is an exposure target area of the photoresist layer formed on the substrate 122, similar to that described with respect to the operation P14 of FIG. 5. The main field area MF has a size determined by the main deflector 154.

In an operation P308, when a deflection distance from the first position to the second position is within the first distance D1, a settling time is set according to the deflection distance so that a settling time for the stabilization of the subsequent beam shot is set to a constant minimum value that is greater than zero, similar to that described with respect to the operation P14 of FIG. 5.

Any one selected from the settling time setting operations according to the operation P20 of FIG. 7, the operation P30 of FIG. 8, the operation P40 of FIG. 9, the operation P50 of FIG. 10, and the operation P60 of FIG. 11, or any one selected from the settling time setting operations described with respect to FIGS. 12A to 12I and FIG. 13 may be used to set a settling time in the operation P308.

In an operation P310, a beam is deflected by using the main deflector 154 based on a settling time set according to the deflection distance in the operation P308 to radiate a beam shot on a second position of the photoresist layer formed on the substrate 122, similar to that described with respect to the operation P18 of FIG. 5.

In an operation P312, the exposure photoresist layer is developed to form a photoresist pattern.

In the case where a feature layer is formed on the substrate 122, the feature layer may be processed by using the photoresist pattern. For example, in order to process the feature layer, the feature layer may be etched by using the photoresist pattern as an etch mask to form a fine feature pattern. As another example, in order to process the feature layer, impurity ions may be implanted in the feature layer by using the photoresist pattern as an ion implantation mask. As another example, in order to process the feature layer, a separate process film may be formed on the feature layer that is exposed via the photoresist pattern formed in the operation P312. The process film may be a conductive layer, an insulating layer, a semiconductor layer, or a combination thereof.

When performing an exposure process by using the exposure system 100 in the IC device manufacturing method described with reference to FIG. 14, the settling time Ts may be prevented from being longer than needed while travelling a relatively short deflection distance by uniformly setting the settling time Ts to the minimum value Tmin regardless of the deflection distance in the case where the deflection distance D of a beam shot deflected by the main deflector 154 of the exposure system 100 is within the first distance D1.

In addition, the settling time setting operation of the operation P308 further includes an operation of setting the settling time Ts to a constant maximum value Tmax in a section in which the deflection distance D is relatively large, as illustrated in FIGS. 12E, 12F, 12G, and 12H. Thus, the setting of a settling time that is unconditionally proportional to a deflection distance and, thus, is longer than needed may be suppressed also in the case of travelling a relatively long deflection distance. As a result, a time that is required for an exposure process may be effectively reduced and, thus, the productivity of an exposure process may be improved by removing unnecessary waiting time.

Figure 15:
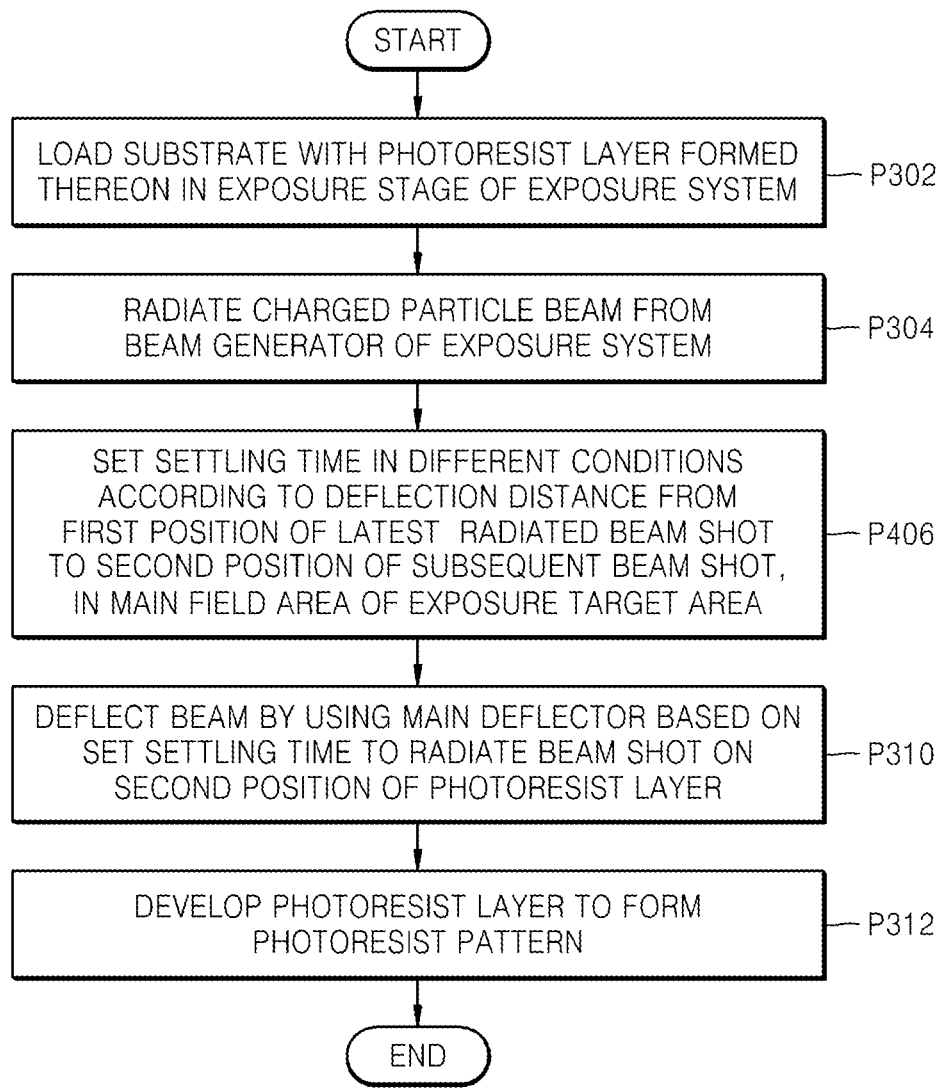
FIG. 15 is a flowchart of a method of manufacturing an IC device, according to some example embodiments of the inventive concepts.

FIG. 15 is a flowchart of a method of manufacturing an IC device, according to some example embodiments of the inventive concepts.

The method of manufacturing an IC device is described with reference to FIGS. 1-11, 12A-12I, and 13-15. Below, like reference numerals are used with respect to a process that is the same as or similar to that described with reference to FIG. 14 and, thus, detailed descriptions thereof will be omitted.

After performing an operation P302 and an operation P304 of FIG. 15 as described with reference to FIG. 14, a settling time for stabilization of a subsequent beam shot is set in different conditions according to a deflection distance from a first position of the latest radiated beam shot to a second position of the subsequent beam shot, in a main field area of an exposure target area of the photoresist layer formed on the substrate 122 (operation P406). The main field area has a size determined by the main deflector 154.

Any one selected from the settling time setting operations according to the operation P14 and the operation P16 of FIG. 5, the operation P14 and the operation P20 of FIG. 7, the operation P14 and the operation P30 of FIG. 8, the operation P14 and the operation P40 of FIG. 9, the operation P14 and the operation P50 of FIG. 10, and the operation P14 and the operation P60 of FIG. 11, or any one selected from the settling time setting operations described with respect to FIGS. 12A to 12I and FIG. 13 may be used to set a settling time in the operation P406.

Next, the operation P310 and the operation P312 described with reference to FIG. 14 are performed.

When performing an exposure process by using the exposure system 100 in the IC device manufacturing method described with reference to FIG. 15, unnecessary waiting time may be removed during the exposure process for manufacturing an IC device by setting the settling time in different conditions according to a deflection distance in a main field area MF of the exposure target area. The main field area MF has a size determined by the main deflector 154. Thus, the productivity of the exposure process may be improved.

Figure 16:
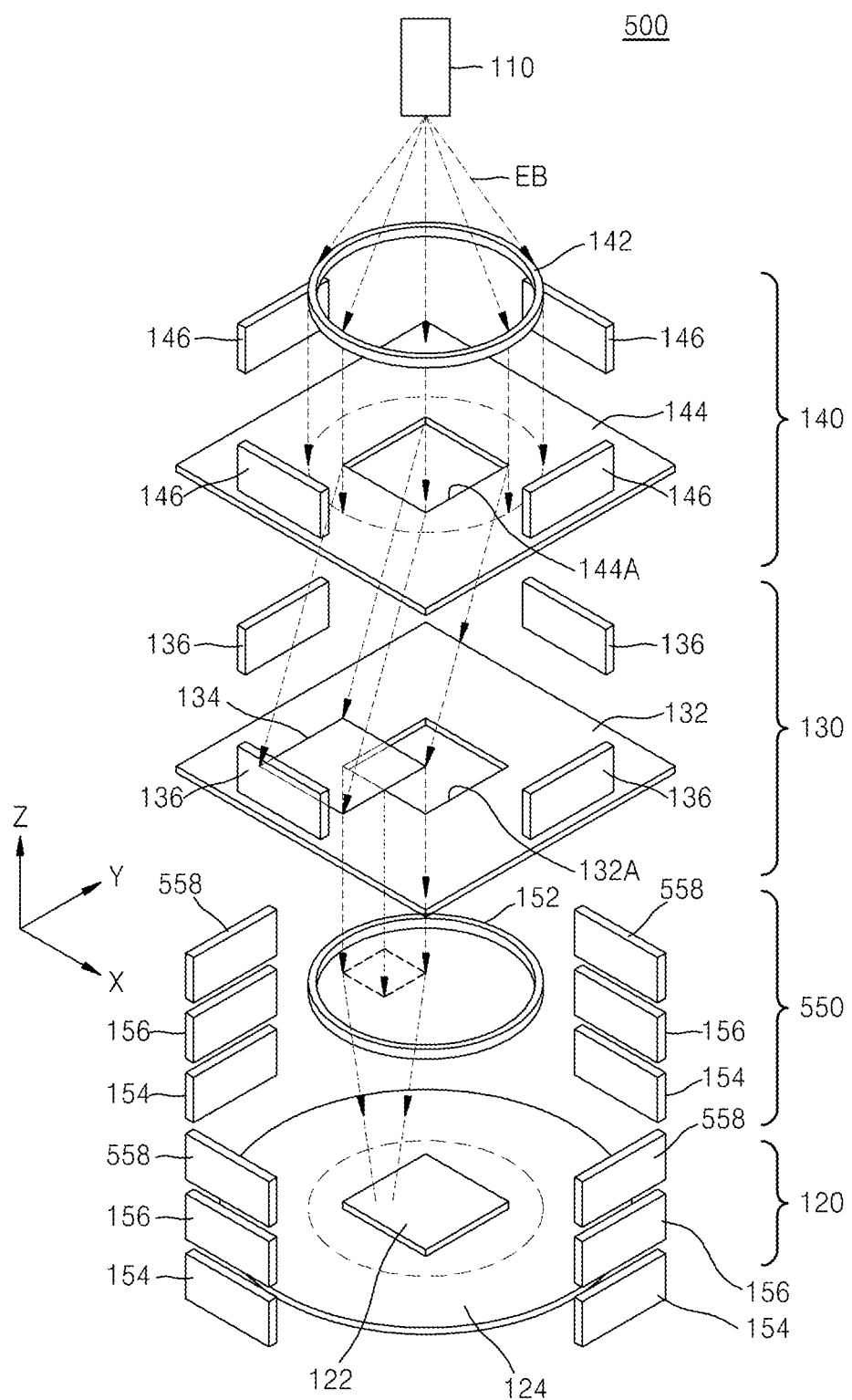
FIG. 16 is a diagram illustrating a schematic configuration of an exposure system according to some example embodiments of the inventive concepts.

FIG. 16 is a diagram illustrating a schematic configuration of an exposure system 500 according to some example embodiments of the inventive concepts.

The exposure system 500 illustrated in FIG. 16 has substantially the same configuration as the exposure system 100 illustrated in FIG. 1. However, a deflection and reduction projector 550 of the exposure system 500 is a deflection unit for determining a position of a beam shot that is radiated on a substrate 122 loaded in an XY stage 124 and adopts a three-stage deflection structure including a tertiary deflector 558, as well as a main deflector 154 and a sub-deflector 156.

Figure 17:
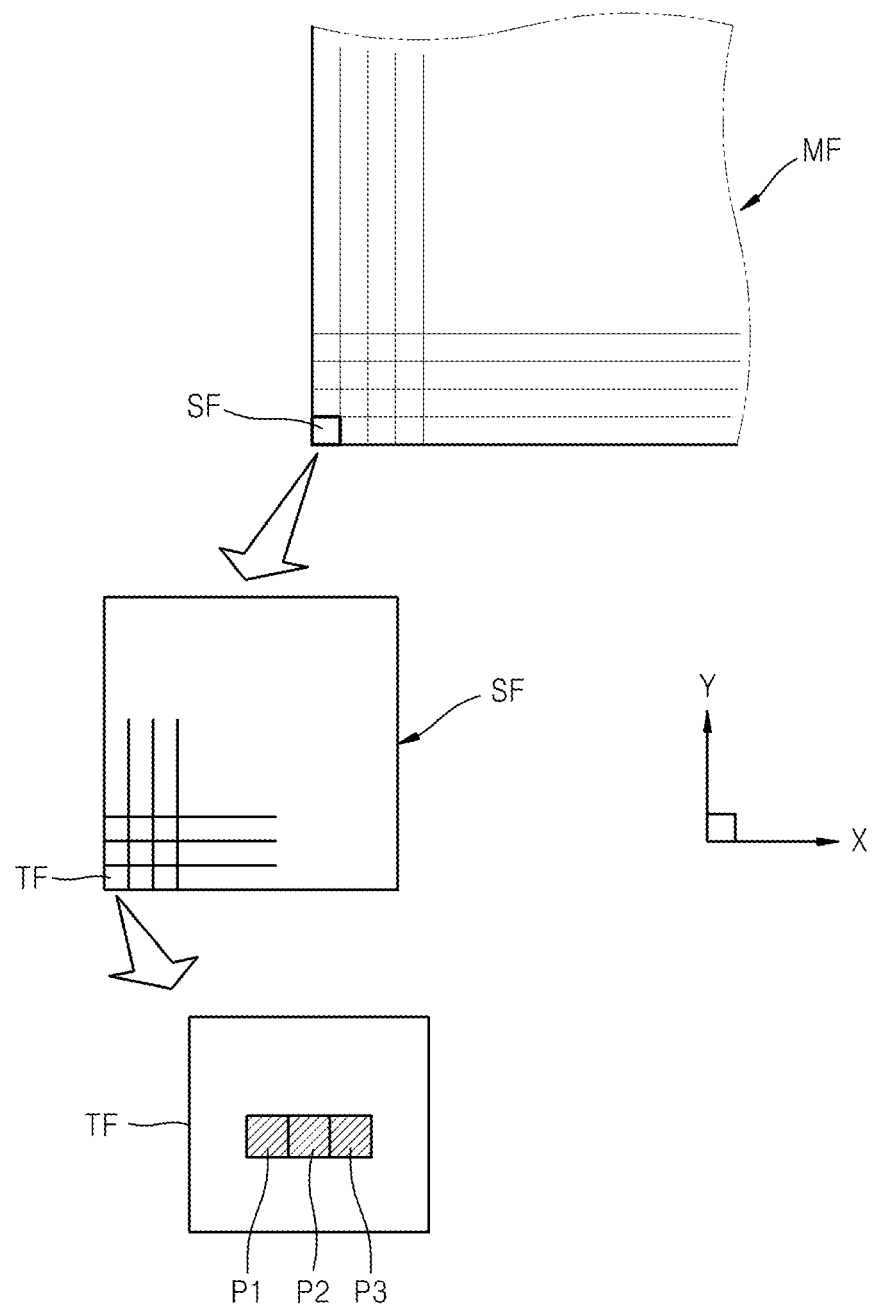
FIG. 17 is a diagram for explaining a main field area, a sub-field area, and a tertiary field area in the exposure system illustrated in FIG. 16.

FIG. 17 is a diagram for explaining a main field area MF having a size in a range which may be deflected by the main deflector 154, a sub-field area SF having a size in a range which may be deflected by the sub-deflector 156, and a tertiary field area TF having a size in a range which may be deflected by the tertiary deflector 558, in the exposure system 500 illustrated in FIG. 16.

Referring to FIG. 17, the main field area MF may be virtually divided into a plurality of sub-field areas SF each having a certain size in the X-direction and the Y-direction.

The plurality of sub-field areas SF each may be virtually divided into a plurality of tertiary field areas TF each having a certain size in the X-direction and the Y-direction.

In some example embodiments, the main field area MF may have a length of about 50 μm to about 450 μm in each of the X- and Y-directions, each of the plurality of sub-field areas SF may have a length of about 1 μm to about 9 μm in each of the X- and Y-directions, and each of the plurality of tertiary field areas TF may have a length of about 0.5 μm to about 1 μm in each of the X- and Y-directions. However, the inventive concepts are not limited thereto.

In some example embodiments, the main field area MF, the plurality of sub-field areas SF, and the plurality of tertiary field areas TF each may have a square shape. In some example embodiments, the ratio (LS:LM) of the length LS of one side of the sub-field area SF to the length LM of one side of the main field area MF may be 1:50 or smaller.

In the exposure system 500 having a three-stage deflection structure as illustrated in FIG. 16, an writing process may be performed for each stripe area STP (refer to FIG. 3) on the substrate 122. To this end, the XY stage 124 may radiate a beam shot in the X-direction in a first stripe area STP while continuously moving in one direction (e.g., the −X-direction). After the writing for the first stripe area STP is completed, a beam shot may be radiated in a second stripe area STP in the same direction as that used during the writing process of the first stripe area STP or the opposite direction thereto. Next, a beam shot may be radiated with respect to subsequent stripe areas STP in turn in the same manner to perform an exposure process.

A beam is deflected by using the main deflector 154, the sub-deflector 156, and the tertiary deflector 558 so that a beam shot may be radiated on a required position on the substrate 122 while performing an exposure process for the plurality of stripe areas STP in the manner as described above. In this case, the exposure process may be performed by using a settling time set according to exposure processes as described with reference to FIGS. 5-11, 12A-12I, and 13 according to a deflection distance of the beam shot.

Figure 18:
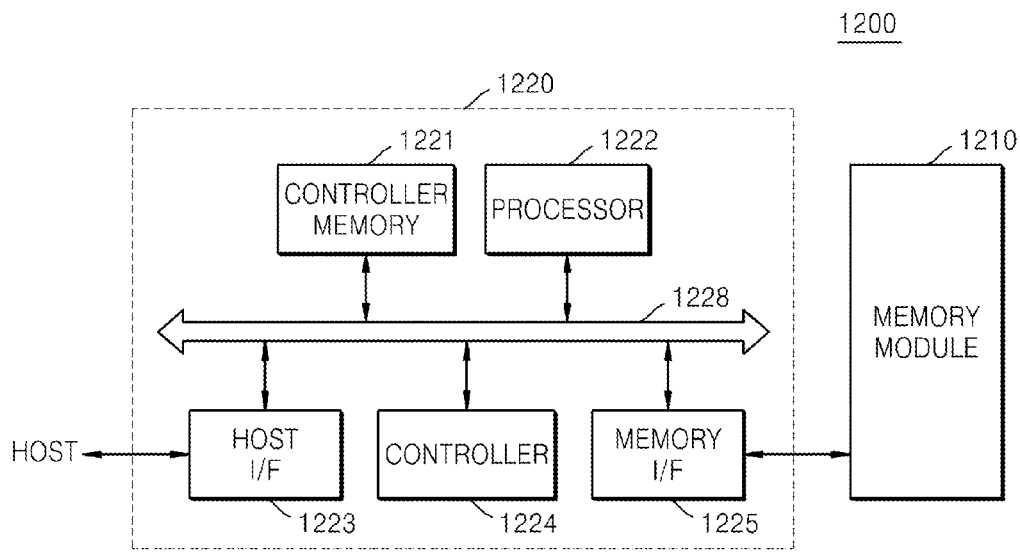
FIG. 18 is a block diagram of a memory card including an IC device manufactured by using a semiconductor device manufacturing method according to some example embodiments of the inventive concepts.

FIG. 18 is a block diagram of a memory card 1200 including an IC device manufactured by the semiconductor device manufacturing method according to some example embodiments of the inventive concepts.

The memory card 1200 includes a memory controller 1220 that generates command and address signals, and a memory module 1210, for example, a flash memory including one flash memory device or a plurality of flash memory devices. The memory controller 1220 includes a host interface 1223 that transmits or receives the command and address signals to or from a host HOST, and a memory interface 1225 that transmits or receives the command and address signals to or from the memory module 1210 again. The host interface 1223, a controller 1224, and the memory interface 1225 communicate with a controller memory 1221, such as a static random-access memory (SRAM), and a processor 1222, such as a central processing unit (CPU), through a common bus 1228.

The memory module 1210 receives the command and address signals from the memory controller 1220, stores data in at least one of the memory devices of the memory module 1210 in response to the signals, and retrieves data from at least one of the memory devices. Each memory device includes a plurality of addressable memory cells and a decoder that generates column and row signals to access at least one of the addressable memory cells during programming and read operations.

Each component of the memory card 1200, including the memory controller 1220, the electronic devices 1221, 1222, 1223, 1224 and 1225 included in the memory controller 1220, and the memory module 1210, may include an IC device manufactured by the IC device manufacturing apparatus according to some example embodiments of the inventive concepts, described with reference to FIGS. 14 and 15. In addition, each component of the memory card 1200, including the memory controller 1220, the electronic devices 1221, 1222, 1223, 1224 and 1225 included in the memory controller 1220, and the memory module 1210, may include an IC device obtained by performing an exposure process using a settling time set by using operations described with reference to FIGS. 5-11, 12A-12I, and 13 according to some example embodiments of the inventive concepts.

Figure 19:
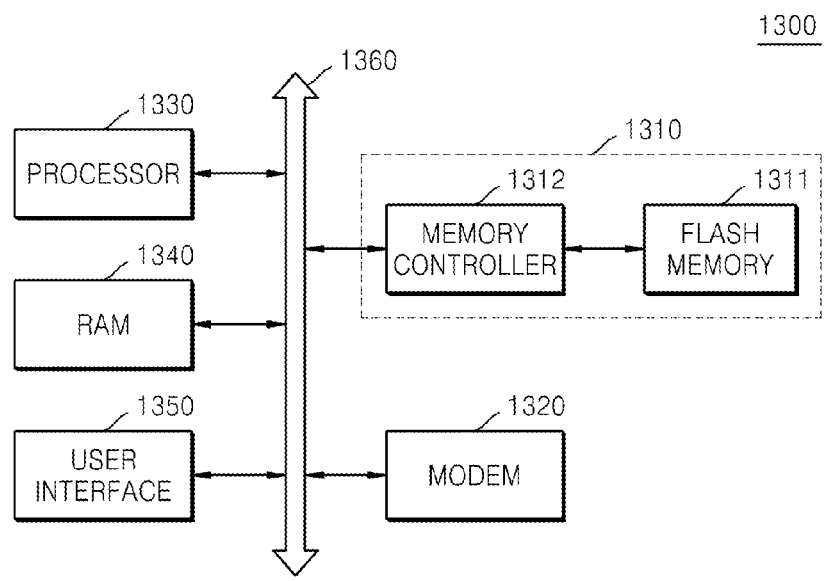
FIG. 19 is a block diagram of a memory system using a memory card including an IC device manufactured by using a method of manufacturing an IC device according to some example embodiments of the inventive concepts.

FIG. 19 is a block diagram of a memory system 1300 using a memory card 1310, including an IC device manufactured by using the method of manufacturing an IC device, according to some example embodiments of the inventive concepts.

The memory system 1300 may include a processor 1330, such as a CPU, a random-access memory (RAM) 1340, a user interface (UI) 1350, and a modem 1320, which communicate with each other through a common bus 1360. Each of the elements transmits a signal to the memory card 1310 and receives a signal from the memory card 1310, through the common bus 1360. The memory card 1310 may include memory 1311 (e.g., flash memory) and memory controller 1312. Each component of the memory system 1300 including the processor 1330, the RAM 1340, the UI 1350, and the modem 1320 along with the memory card 1310 may include an IC device manufactured by using the IC device manufacturing method according to some example embodiments of the inventive concepts. In particular, each component of the memory system 1300 may include an IC device manufactured by using the IC device manufacturing method according to some example embodiments of the inventive concepts, described with reference to FIGS. 14 and 15. In addition, each component of the memory system 1300 may include an IC device obtained by performing an exposure process using a settling time set by using operations described with reference to FIGS. 5-11, 12A-12I, and 13 according to some example embodiments of the inventive concepts.

The memory system 1300 may be applicable to various electronic application fields. For example, the memory system 1300 may be applicable to solid state drives (SSDs), complementary metal-oxide semiconductors (CMOSs) image sensors (CISs), and computer application chipsets.

The memory systems and the devices, described in the present specification, may be packaged in any package form among various package forms including ball grid arrays (BGAs), chip scale packages (CSPs), plastic leaded chip carrier (PLCC), plastic dual in-line package (PDIP), multi-chip package (MCP), wafer-level fabricated package (WFP), and wafer-level processed stack package (WSP). However, the inventive concepts are not limited thereto.

The present general inventive concepts can be embodied as hardware, software, or combinations of hardware and software.

In some example embodiments, some of the elements may be implemented as a 'module'. According to some example embodiments, 'module' means software-based components or hardware components, such as a field programmable gate array (FPGA) or an application specific integrated circuit (ASIC), and the module may perform certain functions. However, the module is not limited to software or hardware. The module may be configured so as to be placed in a storage medium which may perform addressing, or to execute one or more processors.

The above-described method may be written as computer programs and may be implemented in general-use digital computers that execute the programs using a computer-readable recording medium. Data structure used in the above-described method may be recorded in a computer-readable recording medium by using various methods. Examples of the computer-readable recording medium include magnetic storage media (e.g., ROM (Read-Only Memory), RAM (Random-Access Memory), USB (Universal Serial Bus), floppy disks, hard disks, etc.) and storage media such as optical recording media (e.g., CD-ROMs (Compact Disc-ROM), or DVDs (Digital Video Discs)) and PC (personal computer) interfaces (e.g., PCI (Peripheral Component Interconnect), PCI-express, Wi-Fi, etc.).

Some example embodiments may be implemented through a medium including computer-readable codes/instructions to control at least one processing element of the above-described embodiment, for example, a computer-readable medium. Such a medium may correspond to a medium/media that may store and/or transmit the computer-readable codes.

The computer-readable codes may be recorded in a medium or be transmitted over the Internet. For example, the medium may include a ROM, a RAM, a CD-ROM, a magnetic tape, a floppy disc, an optical recording medium, or a carrier wave such as data transmission over the Internet. Further, the medium may be a non-transitory computer-readable medium. Since the medium may be a distributed network, the computer-readable code may be stored, transmitted, and executed in a distributed manner. Further, for example, the processing element may include a processor or a computer processor, and be distributed and/or included in one device.

It should be understood that the example embodiments described herein should be considered in a descriptive sense only and not for purposes of limitation. Descriptions of features or aspects within each embodiment should typically be considered as available for other similar features or aspects in other embodiments.

While some example embodiments of the inventive concepts have been described with reference to the figures, it will be understood by those of ordinary skill in the art that various changes in form and details may be made herein without departing from the spirit and scope of the inventive concepts as defined by the following claims.

What is claimed is:

1. An exposure method, comprising:
   radiating a charged particle beam from a beam generator in an exposure system comprising the beam generator radiating the charged particle beam and main and auxiliary deflectors deflecting the beam radiated from the beam generator to determine a position of a beam shot on a substrate;
   determining whether a deflection distance from a first position of a latest radiated beam shot to a second position of a subsequent beam shot is within a first distance in a main field area of an exposure target area on the substrate, the main field area having a size determined by the main deflector;
   setting a settling time according to the deflection distance so that the settling time for stabilization of the subsequent beam shot is set to a constant minimum value, which is greater than zero, when the deflection distance from the first position to the second position is within the first distance; and deflecting the charged particle beam by using the main deflector to radiate the beam shot on the second position, based on the set settling time.

2. The exposure method of claim 1, wherein the main deflector is configured to deflect the charged particle beam in a main field area having a side of a first field size, wherein the auxiliary deflector is configured to deflect the charged particle beam in a sub-field area having a side of a second field size that is less than the first field size, and wherein the first distance is greater than or equal to the second field size and is less than the first field size.

3. The exposure method of claim 1, wherein the main deflector is configured to deflect the charged particle beam in a main field area having a first field size, wherein the auxiliary deflector is configured to deflect the charged particle beam in a sub-field area having a second field size that is less than the first field size, and wherein a length in a first direction of the main field area is at least 50 times a length in the first direction of the sub-field area.

4. The exposure method of claim 1, wherein the setting of the settling time according to the deflection distance comprises setting the settling time to a constant maximum value when the deflection distance from the first position to the second position corresponds to a section from a second distance, which is greater than the first distance, to a maximum distance to which the main deflector is configured to deflect the charged particle beam.

5. The exposure method of claim 4, wherein the main deflector is deflectable in a main field area having a first field size, and wherein the second distance is less than the first field size.

6. The exposure method of claim 1, wherein the setting of the settling time according to the deflection distance comprises setting the settling time to a value that is determined according to a linear function so that the settling time linearly increases depending on an increase in the deflection distance when the deflection distance from the first position to the second position is greater than the first distance.

7. The exposure method of claim 6, wherein the settling time is set to a value that is determined by an equation (Ts=Tmin+G×ΔD), where 'Ts' is a settling time, 'Main' is the constant minimum value, 'G' is a gradient of the linear function, and 'ΔD' is an amount of change of the deflection distance.

8. The exposure method of claim 1, wherein the setting of the settling time according to the deflection distance comprises:

dividing the deflection distance into a plurality of deflection distance sections in a distance range to which main deflector is configured to deflect the charged particle beam, when the deflection distance from the first position to the second position is greater than the first distance; and setting the settling time to a value that is determined according to a linear function so that the settling time linearly increases as the deflection distance increases in each of consecutive first and second sections selected from the plurality of deflection distance sections;

wherein the settling time is set to a value that is determined according to a linear function having different gradients in the first section and the second section.

9. The exposure method of claim 8, wherein a minimum value of a settling time in the second section is greater than or equal to a maximum value of a settling time in the first section.

10. The exposure method of claim 1, wherein the setting of the settling time according to the deflection distance comprises:

dividing the deflection distance into a plurality of deflection distance sections in a distance range to which the main deflector is configured to deflect the charged particle beam, when the deflection distance from the first position to the second position is greater than the first distance; and setting the settling time to a value that is determined according to a step function in which the settling time is discontinuously changed according to an increase in the deflection distance at a boundary of each of the plurality of deflection distance sections.

11. The exposure method of claim 10, wherein the setting of the settling time according to the deflection distance further comprises setting the settling time to a value that is determined according to a linear function, of which a gradient is greater than zero, according to the increase in the deflection distance, in at least some of the plurality of deflection distance sections.

12. The exposure method of claim 10, wherein the setting of the settling time according to the deflection distance comprises setting the settling time to a value that is determined based on a constant function according to the increase in the deflection distance in at least some of the plurality of deflection distance sections.

13. The exposure method of claim 1, wherein the setting of the settling time according to the deflection distance comprises setting the settling time to a value that is determined according to a function nonlinearly increasing according to an increase in the deflection distance when the deflection distance from the first position to the second position is greater than the first distance.

14. The exposure method of claim 13, wherein the setting of the settling time to the value that is determined according to the function nonlinearly increasing according to the increase in the deflection distance comprises setting the settling time to a value that increases in a form of a log function represented by an equation (Ts=Tmin+$\log_a$(ΔD+1)) according to the increase in the deflection distance, where 'Ts' is a settling time, 'Tmin' is the constant minimum value, 'a' is a real number greater than zero, and 'ΔD' denotes an amount of change of the deflection distance from the first distance.

15. A method of manufacturing an integrated circuit (IC) device, the method comprising:

loading a substrate, with a photoresist layer formed on the substrate, on an exposure stage in an exposure system comprising a beam generator radiating a charged particle beam, main and auxiliary deflectors deflecting the beam radiated from the beam generator to determine a position of a beam shot on the substrate, and the exposure stage on which exposure is performed by using the beam radiated from the beam generator;

radiating the charged particle beam from the beam generator;

determining whether a deflection distance from a first position of a latest radiated beam shot to a second position of a subsequent beam shot is within a first distance, which is greater than or equal to a maximum deflection distance to which the auxiliary deflector is configured to deflect the charged particle beam, in a main field area of an exposure target area on the photoresist layer, the main field area having a size determined by the main deflector;

setting a settling time according to the determined deflection distance so that the settling time for stabilization of the subsequent beam shot is set to a constant minimum value, which is greater than zero, when the determined deflection distance from the first position to the second position is within the first distance;

deflecting the charged particle beam by using the main deflector based on the set settling time and radiating the beam shot on the second position to expose the photoresist layer; and developing the exposed photoresist layer to form a photoresist pattern.

16. An exposure method, comprising:

radiating a charged particle beam from a beam generator;

deflecting the charged particle beam using first and second deflectors;

determining whether a deflection distance from a first position of a latest radiated beam shot to a second position of a subsequent beam shot is within a first distance in a main field area of an exposure target area on a substrate;

setting a settling time according to the determined deflection distance so that the settling time for stabilization of the subsequent beam shot is set to a constant minimum value, which is greater than zero, when the determined deflection distance is within the first distance; and using the first deflector, based on the set settling time, to deflect the subsequent beam shot to the second position.

17. The exposure method of claim 16, wherein the first deflector is configured to deflect the charged particle beam over the main field area of the exposure target area on the substrate, wherein the second deflector is configured to deflect the charged particle beam over a second field area of the exposure target area on the substrate, and wherein the second field area is within the main field area.

18. The exposure method of claim 16, further comprising:

deflecting the charged particle beam using the first and second deflectors, and a third deflector.

19. The exposure method of claim 18, wherein the first deflector is configured to deflect the charged particle beam over the main field area of the exposure target area on the substrate, wherein the second deflector is configured to deflect the charged particle beam over a second field area of the exposure target area on the substrate, wherein the third deflector is configured to deflect the charged particle beam over a third field area of the exposure target area on the substrate, wherein the main field area is larger than the second field area, and wherein the second field area is larger than the third field area.

20. The exposure method of claim 19, wherein the third field area is within the second field area, and wherein the second field area is within the main field area.

* * * * *